United States Patent
Bower et al.

(10) Patent No.: US 10,163,735 B2
(45) Date of Patent: Dec. 25, 2018

(54) PRESSURE-ACTIVATED ELECTRICAL INTERCONNECTION BY MICRO-TRANSFER PRINTING

(71) Applicant: X-Celeprint Limited, Cork (IE)

(72) Inventors: Christopher Andrew Bower, Raleigh, NC (US); Ronald S. Cok, Rochester, NY (US); Matthew Meitl, Durham, NC (US); Carl Ray Prevatte, Jr., Raleigh, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/830,645

(22) Filed: Dec. 4, 2017

(65) Prior Publication Data

US 2018/0090394 A1     Mar. 29, 2018

Related U.S. Application Data

(62) Division of application No. 15/461,703, filed on Mar. 17, 2017, now Pat. No. 10,103,069.

(Continued)

(51) Int. Cl.
*H01L 21/66*     (2006.01)
*H01L 33/56*     (2010.01)
(Continued)

(52) U.S. Cl.
CPC .............. *H01L 22/12* (2013.01); *H01L 22/20* (2013.01); *H01L 22/22* (2013.01); *H01L 24/92* (2013.01);
(Continued)

(58) Field of Classification Search
CPC ......... H01L 22/12; H01L 22/22; H01L 24/11; H01L 24/13; H01L 24/81; H01L 24/83;
(Continued)

(56) References Cited

U.S. PATENT DOCUMENTS

| | | |
|---|---|---|
| 4,764,801 A | 8/1988 | McLaughlin et al. |
| 4,934,267 A | 6/1990 | Hashimoto et al. |

(Continued)

FOREIGN PATENT DOCUMENTS

| | | |
|---|---|---|
| EP | 0281100 B1 | 6/1992 |
| JP | H11-142878 A | 5/1999 |

(Continued)

OTHER PUBLICATIONS

Bower, C. A. et al., Transfer Printing: An Approach for Massively Parallel Assembly of Microscale Devices, IEE, Electronic Components and Technology Conference, 2008, pp. 1105-1109.

(Continued)

*Primary Examiner* — Yosef Gebreyesus
(74) *Attorney, Agent, or Firm* — William R. Haulbrook; Michael D. Schmitt; Choate, Hall & Stewart LLP

(57) ABSTRACT

A printed electrical connection structure includes a substrate having one or more electrical connection pads and a micro-transfer printed component having one or more connection posts. Each connection post is in electrical contact with a connection pad. A resin is disposed between and in contact with the substrate and the component. The resin has a reflow temperature less than a cure temperature. The resin repeatedly flows at the reflow temperature when temperature-cycled between an operating temperature and the reflow temperature but does not flow after the resin is exposed to a cure temperature. A solder can be disposed on the connection post or the connection pad. After printing and reflow, the component can be tested and, if the component fails, another component is micro-transfer printed to the substrate, the resin is reflowed again, the other component is tested and, if it passes the test, the resin is finally cured.

23 Claims, 10 Drawing Sheets

Related U.S. Application Data

(60) Provisional application No. 62/317,107, filed on Apr. 1, 2016.

(51) Int. Cl.
| | | |
|---|---|---|
| *H01L 33/62* | (2010.01) | |
| *H01L 23/00* | (2006.01) | |
| *H01L 25/00* | (2006.01) | |
| *H01L 27/12* | (2006.01) | |
| *H01L 51/00* | (2006.01) | |
| H01L 27/32 | (2006.01) | |
| H01L 51/10 | (2006.01) | |
| H01L 51/52 | (2006.01) | |

(52) U.S. Cl.
CPC ............ *H01L 24/97* (2013.01); *H01L 25/50* (2013.01); *H01L 27/1266* (2013.01); *H01L 33/56* (2013.01); *H01L 33/62* (2013.01); *H01L 51/0022* (2013.01); H01L 22/14 (2013.01); H01L 24/11 (2013.01); H01L 24/13 (2013.01); H01L 24/81 (2013.01); H01L 24/83 (2013.01); H01L 27/3255 (2013.01); H01L 51/102 (2013.01); H01L 51/5203 (2013.01); H01L 2224/02123 (2013.01); H01L 2224/13008 (2013.01); H01L 2224/13013 (2013.01); H01L 2224/13016 (2013.01); H01L 2224/1411 (2013.01); H01L 2224/16237 (2013.01); H01L 2224/7598 (2013.01); H01L 2224/75305 (2013.01); H01L 2224/75315 (2013.01); H01L 2224/81 (2013.01); H01L 2224/814 (2013.01); H01L 2224/8182 (2013.01); H01L 2224/81191 (2013.01); H01L 2224/81815 (2013.01); H01L 2224/81903 (2013.01); H01L 2224/81986 (2013.01); H01L 2224/83 (2013.01); H01L 2224/83192 (2013.01); H01L 2224/83862 (2013.01); H01L 2224/83986 (2013.01); H01L 2224/9211 (2013.01); H01L 2224/951 (2013.01); H01L 2224/95136 (2013.01); H01L 2227/323 (2013.01)

(58) Field of Classification Search
CPC ..... H01L 24/92; H01L 24/97; H01L 27/1266; H01L 27/3255; H01L 2224/02123; H01L 2224/13008; H01L 2224/13016; H01L 2224/1411; H01L 2224/16237; H01L 2224/75305; H01L 2224/75315; H01L 2224/7598; H01L 2224/81; H01L 2224/81191; H01L 2224/814; H01L 2224/81815; H01L 2224/8182; H01L 2224/81903; H01L 2224/81986; H01L 2224/83; H01L 2224/83192; H01L 2224/83862; H01L 2224/83896; H01L 2224/9211; H01L 2224/951; H01L 2224/95136; H01L 2227/323

See application file for complete search history.

(56) References Cited

U.S. PATENT DOCUMENTS

| | | |
|---|---|---|
| 5,388,577 A | 2/1995 | Hubbard |
| 5,550,066 A | 8/1996 | Tang et al. |
| 5,557,149 A | 9/1996 | Richards et al. |
| 5,621,555 A | 4/1997 | Park |
| 5,815,303 A | 9/1998 | Berlin |
| 6,025,730 A | 2/2000 | Akram et al. |
| 6,051,489 A | 4/2000 | Young et al. |
| 6,142,358 A | 11/2000 | Cohn et al. |
| 6,180,239 B1 | 1/2001 | Whitesides et al. |
| 6,277,669 B1 | 8/2001 | Kung et al. |
| 6,278,242 B1 | 8/2001 | Cok et al. |
| 6,400,021 B1 | 6/2002 | Cho |
| 6,448,108 B1 | 9/2002 | Lin |
| 6,544,813 B1 | 4/2003 | Lin |
| 6,555,408 B1 | 4/2003 | Jacobsen et al. |
| 6,577,367 B2 | 6/2003 | Kim |
| 6,717,263 B2 | 4/2004 | Sawai et al. |
| 6,717,560 B2 | 4/2004 | Cok et al. |
| 6,756,576 B1 | 6/2004 | McElroy et al. |
| 6,841,853 B2 | 1/2005 | Yamada |
| 6,933,532 B2 | 8/2005 | Arnold et al. |
| 6,969,624 B2 | 11/2005 | Iwafuchi et al. |
| 6,974,711 B2 | 12/2005 | Yanagisawa et al. |
| 6,998,644 B1 | 2/2006 | Boling et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,380,007 B1 | 5/2008 | Bu et al. |
| 7,453,157 B2 | 11/2008 | Haba et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,622,367 B1 | 11/2009 | Nuzzo et al. |
| 7,662,545 B2 | 2/2010 | Nuzzo et al. |
| 7,667,335 B2 | 2/2010 | Lin et al. |
| 7,691,656 B2 | 4/2010 | Bader et al. |
| 7,704,684 B2 | 4/2010 | Rogers et al. |
| 7,799,699 B2 | 9/2010 | Nuzzo et al. |
| 7,816,856 B2 | 10/2010 | Cok et al. |
| 7,893,533 B2 | 2/2011 | Saito |
| 7,893,612 B2 | 2/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,977,789 B2 | 7/2011 | Park |
| 7,982,296 B2 | 7/2011 | Nuzzo et al. |
| 7,999,454 B2 | 8/2011 | Winters et al. |
| 8,008,182 B2 | 8/2011 | Asakawa |
| 8,029,139 B2 | 10/2011 | Ellinger et al. |
| 8,039,847 B2 | 10/2011 | Nuzzo et al. |
| 8,110,425 B2 | 2/2012 | Yun |
| 8,198,621 B2 | 6/2012 | Rogers et al. |
| 8,207,547 B2 | 6/2012 | Lin |
| 8,261,660 B2 | 9/2012 | Menard |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,449,285 B2 | 5/2013 | McGeehan |
| 8,470,701 B2 | 6/2013 | Rogers et al. |
| 8,502,192 B2 | 8/2013 | Kwak et al. |
| 8,506,867 B2 | 8/2013 | Menard |
| 8,664,699 B2 | 3/2014 | Nuzzo et al. |
| 8,685,764 B2 | 4/2014 | Chu et al. |
| 8,686,447 B2 | 4/2014 | Tomoda et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,809,672 B2 | 8/2014 | Chuang et al. |
| 8,817,369 B2 | 8/2014 | Daiku |
| 8,854,294 B2 | 10/2014 | Sakariya |
| 8,871,547 B2 | 10/2014 | Chu et al. |
| 8,877,648 B2 | 11/2014 | Bower et al. |
| 8,889,485 B2 | 11/2014 | Bower |
| 8,890,315 B2 | 11/2014 | Choi et al. |
| 8,895,406 B2 | 11/2014 | Rogers et al. |
| 8,934,259 B2 | 1/2015 | Bower et al. |
| 8,963,326 B2 | 2/2015 | Bao et al. |
| 8,987,765 B2 | 3/2015 | Bibl et al. |
| 9,082,910 B2 | 7/2015 | Lee et al. |
| 9,214,410 B2 | 12/2015 | Kim et al. |

(56) References Cited

U.S. PATENT DOCUMENTS

| | | | |
|---|---|---|---|
| 9,224,680 B2 | 12/2015 | Chen et al. | |
| 9,238,309 B2 | 1/2016 | King et al. | |
| 9,252,094 B2 | 2/2016 | Choi et al. | |
| 9,307,652 B2 | 4/2016 | Bower | |
| 9,358,775 B2 | 6/2016 | Bower et al. | |
| 9,368,683 B1 | 6/2016 | Meitl et al. | |
| 9,401,344 B2 | 7/2016 | Bower et al. | |
| 9,508,666 B2 | 11/2016 | Yu et al. | |
| 9,550,353 B2 | 1/2017 | Bower et al. | |
| 9,555,644 B2 | 1/2017 | Rogers et al. | |
| 9,627,744 B2* | 4/2017 | Handy | H01Q 21/065 |
| 9,704,821 B2 | 7/2017 | Meitl et al. | |
| 2001/0040298 A1 | 11/2001 | Baba et al. | |
| 2002/0050220 A1 | 5/2002 | Schueller et al. | |
| 2003/0027083 A1 | 2/2003 | Fuller et al. | |
| 2003/0222353 A1 | 12/2003 | Yamada | |
| 2004/0192041 A1 | 9/2004 | Jeong et al. | |
| 2004/0259290 A1 | 12/2004 | Brintzinger et al. | |
| 2005/0181655 A1 | 8/2005 | Haba et al. | |
| 2005/0202595 A1 | 9/2005 | Yonehara et al. | |
| 2005/0285246 A1 | 12/2005 | Haba et al. | |
| 2006/0051900 A1 | 3/2006 | Shizuno | |
| 2006/0063309 A1 | 3/2006 | Sugiyama et al. | |
| 2007/0075423 A1 | 4/2007 | Ke et al. | |
| 2007/0080464 A1 | 4/2007 | Goebel et al. | |
| 2007/0085102 A1 | 4/2007 | Orita | |
| 2007/0120268 A1* | 5/2007 | Irsigler | H01L 21/563 257/778 |
| 2007/0145550 A1 | 6/2007 | Haba et al. | |
| 2008/0067663 A1 | 3/2008 | Kang et al. | |
| 2008/0108171 A1 | 5/2008 | Rogers et al. | |
| 2008/0111146 A1 | 5/2008 | Nakamura et al. | |
| 2008/0131822 A1 | 6/2008 | Liao et al. | |
| 2008/0150121 A1 | 6/2008 | Oganesian et al. | |
| 2008/0164575 A1 | 7/2008 | Ikeda et al. | |
| 2008/0185705 A1 | 8/2008 | Osborn et al. | |
| 2008/0202365 A1 | 8/2008 | Schneider et al. | |
| 2009/0014205 A1 | 1/2009 | Kobayashi et al. | |
| 2009/0133914 A1 | 5/2009 | Dellmann et al. | |
| 2009/0146303 A1 | 6/2009 | Kwon | |
| 2009/0199960 A1 | 8/2009 | Nuzzo et al. | |
| 2009/0283903 A1 | 11/2009 | Park | |
| 2009/0301771 A1 | 12/2009 | Ochi et al. | |
| 2010/0006876 A1 | 1/2010 | Moteki et al. | |
| 2010/0062098 A1 | 3/2010 | Ando et al. | |
| 2010/0096175 A1 | 4/2010 | Ishimatsu et al. | |
| 2010/0123134 A1 | 5/2010 | Nagata | |
| 2010/0123268 A1 | 5/2010 | Menard | |
| 2010/0147567 A1 | 6/2010 | Hino et al. | |
| 2010/0155989 A1 | 6/2010 | Ishii et al. | |
| 2010/0190293 A1 | 7/2010 | Maeda et al. | |
| 2010/0248484 A1 | 9/2010 | Bower et al. | |
| 2010/0265440 A1 | 10/2010 | French et al. | |
| 2010/0289115 A1 | 11/2010 | Akiyama et al. | |
| 2010/0308008 A1 | 12/2010 | Zhu et al. | |
| 2011/0182805 A1 | 7/2011 | DeSimone et al. | |
| 2011/0215466 A1 | 9/2011 | Hsu et al. | |
| 2011/0219973 A1 | 9/2011 | Gullentops et al. | |
| 2011/0266670 A1 | 11/2011 | England et al. | |
| 2012/0000379 A1 | 1/2012 | Greener et al. | |
| 2012/0043130 A1 | 2/2012 | Rathburn | |
| 2012/0074532 A1 | 3/2012 | Shih et al. | |
| 2012/0104624 A1 | 5/2012 | Choi et al. | |
| 2012/0126229 A1 | 5/2012 | Bower | |
| 2012/0168776 A1 | 7/2012 | Nakamura et al. | |
| 2012/0206421 A1 | 8/2012 | Cok et al. | |
| 2012/0228669 A1 | 9/2012 | Bower et al. | |
| 2012/0242638 A1 | 9/2012 | Zhong et al. | |
| 2012/0256346 A1 | 10/2012 | Ogino et al. | |
| 2012/0281379 A1 | 11/2012 | Shimada | |
| 2012/0306073 A1 | 12/2012 | Yu et al. | |
| 2012/0313241 A1 | 12/2012 | Bower | |
| 2012/0314388 A1 | 12/2012 | Bower et al. | |
| 2012/0321738 A1 | 12/2012 | Ishii et al. | |
| 2012/0328728 A1 | 12/2012 | Nakatsuka et al. | |
| 2013/0068720 A1 | 3/2013 | Taniguchi | |
| 2013/0069275 A1 | 3/2013 | Menard et al. | |
| 2013/0077272 A1 | 3/2013 | Lin et al. | |
| 2013/0078576 A1 | 3/2013 | Wu et al. | |
| 2013/0088416 A1 | 4/2013 | Smith et al. | |
| 2013/0196474 A1 | 8/2013 | Meitl et al. | |
| 2013/0207964 A1 | 8/2013 | Fleck et al. | |
| 2013/0221355 A1 | 8/2013 | Bower et al. | |
| 2013/0228897 A1 | 9/2013 | Chen et al. | |
| 2013/0273695 A1 | 10/2013 | Menard et al. | |
| 2013/0316487 A1* | 11/2013 | de Graff | H01L 27/14683 438/66 |
| 2013/0333094 A1 | 12/2013 | Rogers et al. | |
| 2013/0337608 A1 | 12/2013 | Kotani et al. | |
| 2014/0015124 A1 | 1/2014 | Fay et al. | |
| 2014/0084450 A1 | 3/2014 | Nielson et al. | |
| 2014/0094878 A1 | 4/2014 | Gossler et al. | |
| 2014/0104243 A1 | 4/2014 | Sakariya et al. | |
| 2014/0159064 A1 | 6/2014 | Sakariya et al. | |
| 2014/0159065 A1 | 6/2014 | Hu et al. | |
| 2014/0182912 A1 | 7/2014 | Lin et al. | |
| 2014/0252604 A1 | 9/2014 | Motoyoshi | |
| 2014/0264763 A1 | 9/2014 | Meitl et al. | |
| 2014/0267683 A1 | 9/2014 | Bibl et al. | |
| 2014/0327132 A1 | 11/2014 | Zhang et al. | |
| 2014/0367633 A1 | 12/2014 | Bibl et al. | |
| 2015/0028473 A1 | 1/2015 | Kim et al. | |
| 2015/0102807 A1 | 4/2015 | Eckinger et al. | |
| 2015/0135525 A1 | 5/2015 | Bower | |
| 2015/0137153 A1 | 5/2015 | Bibl et al. | |
| 2015/0163906 A1 | 6/2015 | Bower et al. | |
| 2015/0348926 A1 | 12/2015 | Bower | |
| 2015/0371874 A1 | 12/2015 | Bower et al. | |
| 2016/0016399 A1 | 1/2016 | Bower et al. | |
| 2016/0018094 A1 | 1/2016 | Bower et al. | |
| 2016/0020120 A1 | 1/2016 | Bower et al. | |
| 2016/0020127 A1 | 1/2016 | Bower et al. | |
| 2016/0020130 A1 | 1/2016 | Bower et al. | |
| 2016/0020131 A1 | 1/2016 | Bower et al. | |
| 2016/0020187 A1 | 1/2016 | Okada et al. | |
| 2016/0056223 A1 | 2/2016 | Bower et al. | |
| 2016/0093600 A1 | 3/2016 | Bower et al. | |
| 2016/0262268 A1 | 9/2016 | Co et al. | |
| 2017/0047303 A1 | 2/2017 | Meitl et al. | |
| 2017/0047306 A1 | 2/2017 | Meitl et al. | |
| 2017/0048976 A1 | 2/2017 | Prevatte et al. | |
| 2017/0154819 A1 | 6/2017 | Bower et al. | |
| 2017/0213803 A1 | 7/2017 | Bower | |
| 2017/0287789 A1 | 10/2017 | Bower et al. | |
| 2018/0031974 A1 | 2/2018 | Prevatte et al. | |
| 2018/0042110 A1 | 2/2018 | Cok | |

FOREIGN PATENT DOCUMENTS

| | | |
|---|---|---|
| JP | 2005 099410 A | 4/2005 |
| WO | WO-2008/103931 A2 | 8/2008 |
| WO | WO-2016/012409 A2 | 1/2016 |
| WO | WO-2017/167954 A2 | 10/2017 |

OTHER PUBLICATIONS

Cok, R. S. et al., 60.3: AMOLED Displays Using Transfer-Printed Integrated Circuits, Society for Information Display, 10:902-904 (2010).

Foest, R. et al., Kalte Normaldruck-Jetplasmen zur lokalen Oberflächenbehandlung, Vakuum in Forschung und Praxis, 21(6):17-21, (2009).

Hamer et al., 63.2: AMOLED Displays Using Transfer-Printed Integrated Circuits, SID 09 Digest, 40(2):947-950 (2009).

Howlader, M. M. R. et al., Nanobonding Technology Toward Electronic, Fluidic, and Photonic Systems Integration, IEEE, Journal of Selected Topics in Quantum Electronics, 17(3):689-703, (2011).

International Search Report, PCT/EP2017/057664 (Pressure-Activated Electrical Interconnection by Micro-Transfer Printing, filed Mar. 31, 2017), ISA/EPO, dated Oct. 10, 2017, 6 pages.

(56) References Cited

OTHER PUBLICATIONS

Invitation to Pay Additional Fees with Partial International Search, PCT/EP2017/057664, (Pressure-Activated Electrical Interconnection by Micro-Transfer Printing, filed Mar. 31, 2017), ISA/EPO, dated Aug. 18, 2017, 14 pages.

Kim, S. et al, Microstructural elastomeric surfaces with reversible adhesion and examples of their use in deterministic assembly by transfer printing, PNAS, 107(40):17095-17100 (2010).

Roscher, H., VCSEL Arrays with Redundant Pixel Designs for 10Gbits/s 2-D Space-Parallel MMF Transmission, Annual Report, optoelectronics Department, (2005).

Written Opinion, PCT/EP2017/057664 (Pressure-Activated Electrical Interconnection by Micro-Transfer Printing, filed Mar. 31, 2017), ISA/EPO, dated Oct. 10, 2017, 12 pages.

Yaniv et al., A 640×480 Pixel Computer Display Using Pin Diodes with Device Redundancy, 1988 International Display Research Conference, IEEE, CH-2678-1/88:152-154 (1988).

\* cited by examiner

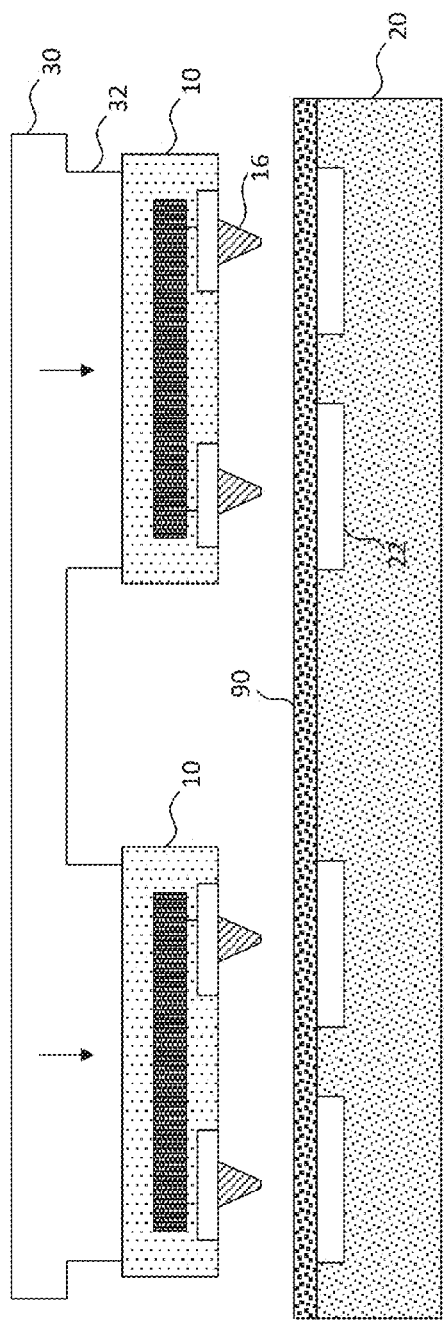
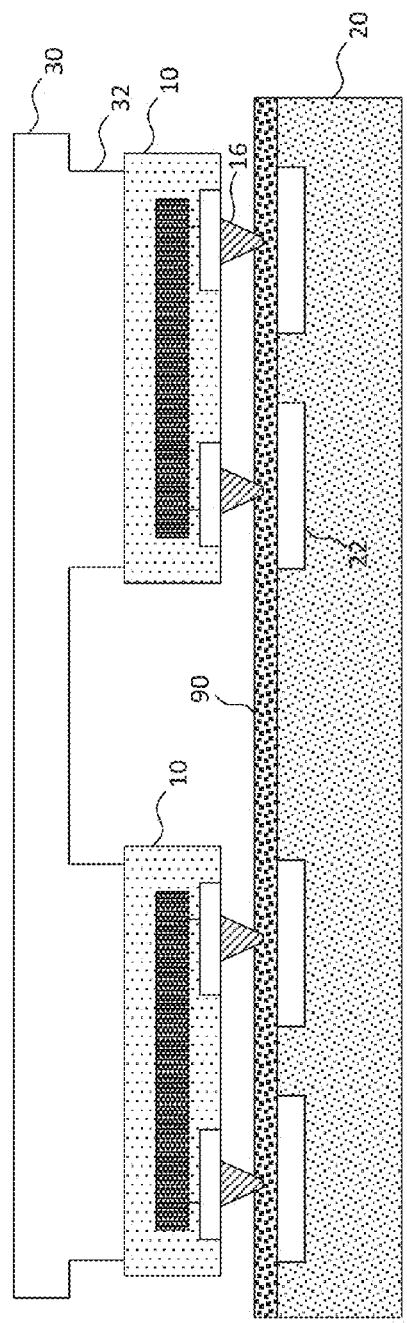
FIG. 4
FIG. 5

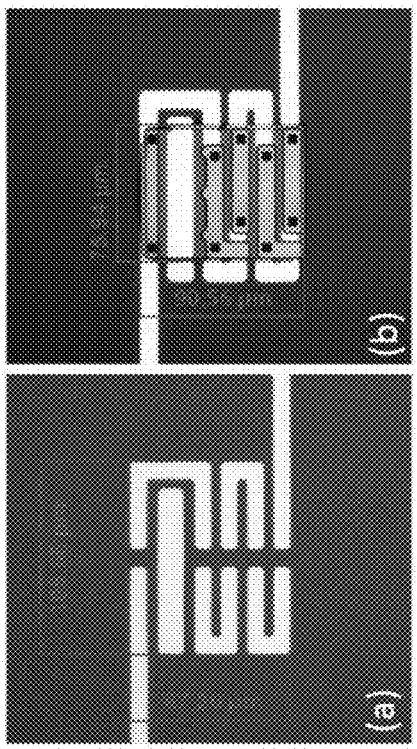
FIG. 12
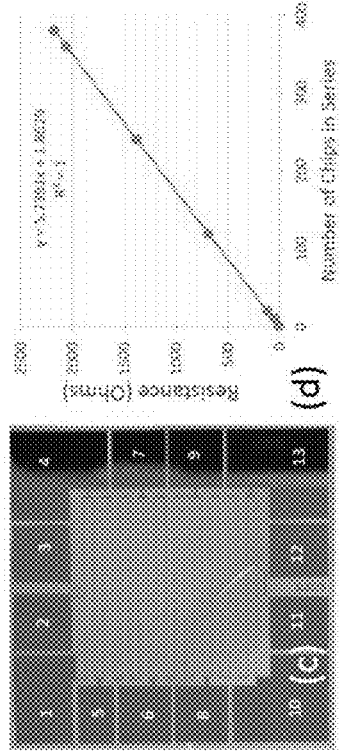
FIG. 13
FIG. 11

PRESSURE-ACTIVATED ELECTRICAL INTERCONNECTION BY MICRO-TRANSFER PRINTING

PRIORITY APPLICATION

This application is a division of U.S. patent application Ser. No. 15/461,703, filed Mar. 17, 2017, entitled Pressure Activated Electrical Interconnection by Micro-Transfer Printing, which claims priority to and benefit of U.S. Patent Application No. 62/317,107, filed Apr. 1, 2016, entitled Pressure-Activated Electrical Interconnection by Micro-Transfer Printing, the content of each of which is hereby incorporated by reference herein in its entirety.

CROSS REFERENCE TO RELATED APPLICATION

Reference is made to U.S. Pat. No. 8,889,485, entitled Methods for Surface Attachment of Flipped Active Components by Christopher Bower, to U.S. patent application Ser. No. 14/822,864, entitled Chiplets with Connection Posts by Prevatte et al, to U.S. patent application Ser. No. 14/743,788, entitled Micro Assembled LED Displays and Lighting Elements by Bower et al., and to U.S. patent application Ser. No. 15/373,865, entitled Micro-Transfer Printable Electronic Component by Cok et al., the disclosures of which are incorporated herein by reference in their entirety.

FIELD OF THE INVENTION

The present invention relates to structures and methods for electrically interconnecting chiplets to backplane electrical contact pads using micro transfer printing.

BACKGROUND OF THE INVENTION

Substrates with electronically active components distributed over the extent of the substrate may be used in a variety of electronic systems, for example, flat-panel imaging devices such as flat-panel liquid crystal or organic light emitting diode (OLED) display devices and in flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging may be used.

Electronically active components are typically formed on a substrate by sputtering a layer of inorganic semiconductor material or by spin-coating organic material over the entire substrate. Inorganic semiconductor materials can be processed to improve their electronic characteristics, for example amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor layer. The substrate and layer of semiconductor material can be photo-lithographically processed to define electronically active components, such as transistors. Such transistors are known as thin-film transistors (TFTs) since they are formed in a thin layer of semiconductor material, typically silicon. Transistors may also be formed in thin layers of organic materials. In these devices, the substrate is often made of glass, for example Corning Eagle® or Jade® glass designed for display applications.

The above techniques have some limitations. Despite processing methods used to improve the performance of thin-film transistors, such transistors may provide performance that is lower than the performance of other integrated circuits formed in mono-crystalline semiconductor material. Semiconductor material and active components can be provided only on portions of the substrate, leading to wasted material and processing costs. The choice of substrate materials can also be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment used to process large substrates with thin-film circuitry is relatively expensive. Other substrate materials that may be used include quartz, for example, for integrated circuits using silicon-on-insulator structures as described in U.S. Patent Application No. 2010/0289115 and U.S. Patent Application No. 2010/0123134. However, such substrate materials can be more expensive or difficult to process.

Other methods used for distributing electronically functional components over a substrate in the circuit board assembly industry include pick-and-place technologies for integrated circuits provided in a variety of packages, for example, pin-grid arrays, ball-grid arrays, and flip-chips. However, these techniques may be limited in the size of the integrated circuits that can be placed.

In other manufacturing techniques, a mono-crystalline semiconductor wafer is employed as the substrate. While this approach can provide substrates with the same performance as integrated circuits, the size of such substrates may be limited, for example, to a 12-inch diameter circle, and the wafers are relatively expensive compared to other substrate materials such as glass, polymer, or quartz.

In yet another approach, thin layers of semiconductor are bonded to a substrate and then processed. Such a method is known as semiconductor-on-glass or silicon-on-glass (SOG) and is described, for example, in U.S. Pat. No. 7,605,053, issued Oct. 20, 2009. If the semiconductor material is crystalline, high-performance thin-film circuits can be obtained. However, the bonding technique and the processing equipment for the substrates to form the thin-film active components on large substrates can be relatively expensive.

Publication No. 11-142878 of the Patent Abstracts of Japan entitled *Formation of Display Transistor Array Panel* describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method may require etching a significant quantity of material, and may risk damaging the exposed TFT array.

Other methods for locating material on a substrate are described in U.S. Pat. No. 7,127,810. In this approach, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated, peeling the film in the abraded areas from the first substrate and transferring it to the second substrate. In one embodiment, a plurality of objects is selectively transferred by employing a plurality of laser beams to abrade selected area. Objects to be transferred can include thin-film circuits.

U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate. For example, a light-emitting device (LED) is made of a nitride semiconductor on a sapphire substrate. The energy beam is directed to the interface between the sapphire substrate and the nitride semiconductor releasing the LED and allowing the LED to adhere to a holding substrate coated with an adhesive. The adhesive is then cured. These methods, however, may require the patterned deposition of adhesive on the object(s) or on the second substrate. Moreover, the laser beam that irradiates the object may need to be shaped to match the shape of the object, and the laser abrasion can damage the object to be transferred. Furthermore, the adhesive cure takes time, which may reduce the throughput of the manufacturing system.

Micro-transfer-printing is an advanced assembly technology for applications that benefit from heterogeneous integration of high-performance micro-scale devices. Micro-device systems compatible with micro-transfer-printing include silicon integrated circuits, solar cells, light emitting diodes, compound semiconductor transistors, and lasers.

In micro-transfer-printing, engineered viscoelastic elastomer stamps are used to pick up and transfer arrays of components from the native substrate on or in which the components are formed onto non-native destination substrates. The components are fabricated using mature materials and processes, and are made print-compatible using micromachining or etching processes which leave the micro-components undercut. The undercut components remain fixed to the native wafer through tethering structures connected to non-undercut anchors. Conventional photolithographic methods are then used to form thin-film metal traces which interconnect the printed device arrays.

Such a micro-transfer printing method for transferring active components from one substrate to another is described in "AMOLED Displays using Transfer-Printed Integrated Circuits" published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In such system it is necessary to electrically connect the small integrated circuits or chiplets to electrically conductive elements such as backplane contact pads on the destination substrate. By applying electrical signals to conductors on the destination substrate the small integrated circuits are energized and made operational. The electrical connections between the small integrated circuits and the backplane contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the connection pads on the destination substrate. Additional layers, such as interlayer dielectric insulators can also be required. This process is expensive and requires a number of manufacturing steps. Moreover, the topographical structure of the small integrated circuits over the destination substrate renders the electrical connections problematic. For example, it can be difficult to form a continuous conductor from the destination substrate to the small integrated circuit because of the differences in height over the surface between the small integrated circuits and the destination substrate.

There is a need, therefore, for structures and methods that enable the electrical interconnection of small integrated circuits, such as micro-transfer printed chiplets, to destination substrates.

SUMMARY OF THE INVENTION

In one aspect, the disclosed technology includes a printed electrical connection structure, including: a substrate having one or more electrical connection pads; a printed component having one or more connection posts, each connection post in electrical contact with a connection pad; and a resin disposed between and in contact with the substrate and the printed component, the resin having a reflow temperature less than a cure temperature, wherein the resin repeatedly flows at the reflow temperature when temperature cycled between an operating temperature and the reflow temperature but does not flow after the resin is exposed to the cure temperature.

In certain embodiments, the printed structure includes a solder disposed on the connection post, on the connection pad or on both the connection post and the connection pad.

In certain embodiments, the solder is in electrical contact with both the connection post and the connection pad.

In certain embodiments, the solder has a melting temperature between the reflow temperature and the cure temperature.

In certain embodiments, the solder has a melting temperature less than or equal to the reflow temperature.

In certain embodiments, the solder has a melting temperature greater than or equal to the cure temperature.

In certain embodiments, the connection pad includes metal and the solder is softer than the connection pad.

In certain embodiments, the printed structure includes a plurality of connection posts and connection pads each connection post electrically connected to at least one connection pad.

In certain embodiments, the resin is at least partly between two or more connection posts, substantially fills the volume between the printed component and the substrate defined by the area defined or bounded by the two or more connection posts, or wherein the resin has a greater thickness between the printed component and the substrate than at least some other areas of the substrate.

In certain embodiments, the printed component is a first printed component, the one or more connection pads are one or more first connection pads, and comprising a second printed component having one or more second connection posts, each second connection post in electrical contact with the second connection pads, the resin is disposed between and in contact with the substrate and the second printed component, and the first and second connection pads are electrically connected so that the first and second components are electrically connected in parallel.

In certain embodiments, the connection pad and the connection post both include metal and the metal of the connection pad has a different hardness than the metal of the connection post.

In another aspect, the disclosed technology includes a method of making a printed structure, including: providing a substrate having one or more electrical connection pads; disposing a resin layer over and in contact with at least a portion of the substrate; and micro-transfer printing a component from a component source wafer to the substrate, the component having one or more connection posts that are each positioned adjacent to a corresponding connection pad, so that the resin contacts at least a portion of the printed component.

In certain embodiments, the resin has a reflow temperature less than a cure temperature, wherein the resin repeatedly flows at a first rate at the reflow temperature when temperature cycled between an operating temperature and the reflow temperature but does not flow after the resin is exposed to a cure temperature.

In certain embodiments, the method includes testing the component.

In certain embodiments, the method includes heating the resin to the reflow temperature and electrically contacting each connection post to the corresponding connection pad.

In certain embodiments, the method includes cooling the structure after heating the resin to the reflow temperature.

In certain embodiments, the method includes reheating the structure to the reflow temperature after cooling the structure.

In certain embodiments, the method includes cooling the structure after reheating the resin to the reflow temperature.

In certain embodiments, the method includes heating the structure to the cure temperature after reheating the resin to the reflow temperature.

In certain embodiments, the method includes testing the structure after reheating the resin to the reflow temperature.

In certain embodiments, the method includes testing the structure after heating the resin to the reflow temperature.

In certain embodiments, the method includes providing a layer of solder over at least the one or more connection pads, the solder having a melting temperature.

In certain embodiments, the method includes heating the structure to the melting temperature.

In certain embodiments, the method includes heating the structure to the melting temperature after heating the structure to the reflow temperature.

In certain embodiments, the method includes heating the structure to the melting temperature after heating the structure to the cure temperature.

In certain embodiments, the method includes providing an electrical conductor electrically connected to one of the connection pads, and cutting the electrical conductor.

In certain embodiments, the component is a first component, the one or more connection pads are one or more first connection pads, and comprising providing one or more second connection pads electrically connected in parallel with the one or more first connection pads.

In certain embodiments, the method includes determining that the first component failed the test.

In certain embodiments, the method includes providing an electrical conductor electrically connected to one of the connection pads, and cutting the electrical conductor.

In certain embodiments, the method includes micro-transfer printing a second component from a source wafer to the substrate, the second component having one or more second connection posts that are each adjacent to a corresponding second connection pad, and the resin is contacted to at least a portion of the second printed component.

In certain embodiments, the method includes heating the resin to the reflow temperature and electrically contacting each second connection post to the corresponding second connection pad.

In certain embodiments, the method includes heating the structure to the reflow temperature, cooling the structure, testing the structure, reheating the structure to the reflow temperature, cooling the structure, and heating the structure to the cure temperature.

In certain embodiments, the component is a first component, the one or more connection pads are one or more first connection pads, comprising providing one or more second connection pads electrically connected in parallel with the one or more first connection pads, determining the first component failed the test, micro-transfer printing a second component from a source wafer to the substrate, the second component having one or more second connection posts that are each adjacent to a corresponding second connection pad, and the resin is contacted to at least a portion of the second printed component.

In certain embodiments, the method includes testing the second component.

In another aspect, the disclosed technology includes a micro-transfer printable component, including: a dielectric substrate having a post side and a circuit side; one or more electrically conductive connection posts protruding from the post side of the dielectric substrate; a circuit disposed on the circuit side of the dielectric substrate; and an electrode electrically connecting each of the connection posts to the circuit.

In certain embodiments, the micro-transfer printable component includes a via corresponding to each connection post, the via extending from the circuit side of the dielectric substrate to a portion of the corresponding connection post, the electrode extending into the via to electrically connect the circuit to the corresponding connection post.

In certain embodiments, the circuit is an LED.

In certain embodiments, the LED includes electrical contacts located on a common side of the LED opposite the dielectric substrate.

In certain embodiments, the LED includes electrical contacts located on a common side of the LED adjacent to the dielectric substrate.

In certain embodiments, the LED emits light through the dielectric substrate.

In certain embodiments, the LED emits light in a direction opposite the dielectric substrate.

In another aspect, the disclosed technology includes a method of making a micro-transfer printable component, includes: providing a sacrificial layer on a source wafer; etching one or more structures into the sacrificial layer; patterning a connection post in each etched structure; depositing a dielectric substrate over the sacrificial layer and each connection post; forming a via in the dielectric substrate over a portion of each corresponding connection post; disposing a circuit on or in the dielectric substrate; and patterning one or more electrodes electrically connecting the circuit to one or more of the connection posts over the dielectric substrate and through the corresponding via to form the micro-transfer printable component.

In certain embodiments, the method includes disposing the circuit by micro-transfer printing the circuit from a circuit source wafer to the dielectric substrate.

In certain embodiments, the method includes etching the sacrificial layer to release the micro-transfer printable component from the source wafer.

In certain embodiments, the method includes micro-transfer printing the micro-transfer printable component to a destination substrate.

In certain embodiments, the method includes forming a tether by etching the sacrificial layer and fracturing the tether by micro-transfer printing the micro-transfer printable component.

In certain embodiments, the circuit is an LED.

In certain embodiments, the method includes a fractured tether connected to the dielectric substrate.

In certain embodiments, the fractured tether is connected to the dielectric substrate, is a part of the dielectric substrate, or includes the same material as the dielectric substrate.

In certain embodiments, the method includes an encapsulation layer having a thickness that is less than the dielectric substrate and wherein the fractured tether is connected to the encapsulation layer, includes the same material as the dielectric substrate, or is a part of the dielectric substrate, and the tether has a thickness less than the dielectric layer thickness.

In accordance with embodiments of the present invention, components such as chiplets incorporating active elements such as transistors or passive elements such as resistors, capacitors, and conductors are micro-transfer printed from a native source wafer to a non-native destination substrate or backplane. In various embodiment, the components are LEDs, electrical connection jumpers, or integrated logic circuits, or a combination of such elements. The components include an electrically conducting connection post that protrudes in a direction away from a component surface and is brought into contact with a connection pad on a destination substrate to form an electrical connection between the component and the destination substrate. The components can be at least partially adhered to the destination substrate by forcefully driving the connection posts into the substrate connection pads when micro-transfer printing, for example by exerting mechanical pressure on the transfer stamp.

The connection posts, the substrate connection pads, or both the connection posts and the substrate connection pads can be deformed or crumpled and the connection post can be driven into or through the substrate connection pad, thereby wedging the connection post in the substrate connection pad to adhere the connection post to the substrate connection pad and form an electrical contact between them. As a consequence, the connection post can be welded to the substrate connection pad. An additional heat treatment can be provided to facilitate the welding. Alternatively or additionally, a layer of metal, for example a solder can be provided on either the surface of the connection post or the substrate connection pad, or both, that can be heated, causing the solder to reflow and thereby both adhere and electrically connect the connection post to the substrate connection pad.

In an embodiment of the present invention, an adhesive layer adheres the component to the destination substrate and facilitates an electrical connection between the connection post and the connection pad. In this embodiment, a printed electrical connection structure includes a substrate having one or more electrical connection pads. A printed component has one or more connection posts and each connection post is in electrical contact with a connection pad. A resin is disposed between and in contact with the substrate and the printed component. The resin has an operating temperature that is less than a reflow temperature and the reflow temperature is less than a cure temperature. Until the resin is brought to the cure temperature, it can flow at the reflow temperature so that the resin repeatedly flows at the reflow temperature when temperature-cycled between an operating temperature and the reflow temperature but does not flow after the resin is exposed to a cure temperature. Thus, the resin does not substantially flow at the operating temperature but does flow at the reflow temperature. The resin can be repeatedly temperature-cycled between the two states. When the temperature is raised to a cure temperature greater than the reflow temperature, however, the resin cures and will no longer flow at the reflow temperature.

In another embodiment of the present invention, two or more connection posts are provided to contact a common connection pad. By providing two or more connection posts in contact with a common connection pad, faults in electrical connections between the component and the connection pad are reduced by providing a redundant electrical connection from the component to the connection pad.

In a further embodiment, a solder is disposed on the connection post, the connection pad, or both, and is in electrical contact with both the connection post and the connection pad. The solder can have a melting temperature and can flow at a temperature less than or equal to the reflow temperature, a temperature between the reflow temperature and the cure temperature, or a temperature greater than or equal to the cure temperature. The solder can be softer than a material in the connection pad or in the connection post and the connection post can have a different hardness than the connection pad.

A method of making a printed structure includes providing a substrate having one or more electrical connection pads, disposing a patterned or unpatterned resin layer over and in contact with at least a portion of the substrate, and micro-transfer printing a component from a source wafer to the substrate. The component has one or more connection posts that are each positioned adjacent to or in contact with a corresponding connection pad and the resin is contacted to at least a portion of the printed component. The printed structure is heated to the reflow temperature to reflow the resin, cooled to an operating temperature, and then tested. If the test is passed, the printed structure is heated to the cure temperature and the process is complete. If the test is failed, another component is printed to the substrate, for example by micro-transfer printing the other component to connection pads connected electrically in parallel with the failed component. The printed structure is reheated to the reflow temperature to reflow the resin, cooled to an operating temperature, and then tested again. If the other component passes the test, the printed structure is heated to the cure temperature and the process is complete. If not, the process is repeated.

The resin can be disposed over the substrate and connection pads in an unpatterned layer, for example by coating or lamination. Alternatively, the resin can be disposed in a pattern, for example over the connection pads or between the connection pads, for example using inkjet or photolithographic techniques.

In an embodiment, the connection pads are not electrically connected to the connection posts immediately following micro-transfer printing the component to the substrate. By heating the structure to the reflow temperature, the resin flows and wicks over the substrate, the connection pads, the connection posts, and optionally the component. This reduces the volume between the component and the substrate, drawing the component closer to the substrate and, in particular, embedding the connection posts into the connection pads and forming or improving an electrical connection between the connection posts and the connection pads. Subsequent reflow operations do not undo the electrical connection and can even improve it. Thus, if two components are micro-transfer printed to a substrate, the resin for both reflowed, only one component fails the test, a new component is micro-transfer printed electrically in parallel with the failed component, and the resin for reflowed again, the originally functional component remains functional and electrically connected to its corresponding connection pads.

In a further embodiment, heating the resin to the reflow temperature or cure temperature melts a solder that further facilitates the electrical connection between the connection posts and the connection pads.

In a further embodiment of the present invention, a defective component is removed from the substrate and replaced, for example by micro transfer printing another component to the substrate in the former location of the removed defective chiplet.

In another embodiment, a micro-transfer printable component includes a dielectric substrate having a post side and a circuit side and one or more electrically conductive connection posts protruding from the post side of the dielectric substrate. A circuit is disposed on the circuit side of the dielectric substrate and an electrode electrically connecting each of the connection posts to the circuit. A via corresponding to each connection post can extend from the circuit side of the dielectric substrate to a portion of the corresponding connection post and the electrode can extend into the via to electrically connect the circuit to the corresponding connection post. The circuit can be an LED and the LED can include electrical contacts located on a common side of the LED opposite the dielectric substrate.

Because the components can be made using integrated circuit photolithographic techniques having a relatively high resolution and cost and the destination substrate, for example a printed circuit board, can be made using printed circuit board techniques having a relatively low resolution and cost, the connection pads on the destination substrate can be much larger than the connection posts or electrical contacts on the component, reducing manufacturing costs.

In one aspect, the disclosed technology includes a printable component including a chiplet having a semiconductor substrate and a plurality of electrical connections, wherein each electrical connection comprises an electrically conductive connection post protruding from the semiconductor substrate or a plane parallel to the semiconductor substrate. In an embodiment, the connection post is a multi-layer connection post.

In certain embodiments, the printable component is an active component having an active element, a passive component having a passive element, or a compound structure having a plurality of active elements, passive elements, or a combination of active and passive elements.

In certain embodiments, the printable component has at least one of a width, length, and height from 2 to 5 µm, 5 to 10 µm, 10 to 20 µm, or 20 to 50 µm.

In certain embodiments, the printable component is or includes a light-emitting diode, photo-diode, or transistor.

In another aspect, the disclosed technology includes a printed electrical connection structure comprising a destination substrate and one or more printable components having connection posts, wherein the destination substrate has two or more electrical connection pads and each connection post is in electrical contact with, extends into, or extends through an electrical connection pad of the destination substrate to electrically connect the electrical pads to the connection posts.

In certain embodiments, the electrical contact comprises a material that is the same material as a material included in the connection post.

In certain embodiments, the destination substrate is a member selected from the group consisting of polymer, plastic, resin, polyimide, PEN, PET, metal, metal foil, glass, a semiconductor, and sapphire. In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, a conductive material other than a material of the substrate connection pad or the connection post adheres or electrically connects (e.g., or both) the substrate connection pad to the connection post. In certain embodiments, the substrate connection pad has a first conductive layer and a second conductive layer over the first conductive layer, and the second conductive layer has a lower melting temperature than the first conductive layer, wherein the substrate connection pad is coated with a non-conductive layer, or wherein the substrate connection pad is formed on a compliant non-conductive layer. In certain embodiments, the second conductive layer is a solder or a conductive polymer. In certain embodiments, the second conductive layer is a non-conductive adhesive or a resin.

In certain embodiments, the connection pad is welded to the connection post. In certain embodiments, the substrate connection pads are non-planar and the connection posts are inserted into the backplane contact pads.

In an embodiment, a method of making a micro-transfer printable component includes providing a sacrificial layer on a source wafer and etching one or more structures into the sacrificial layer. A connection post is patterned in each etched structure and a dielectric substrate deposited, laminated, or otherwise disposed over the sacrificial layer and each connection post. A via is formed in the dielectric substrate over a portion of each corresponding connection post and a circuit disposed on or in the dielectric substrate. One or more electrodes electrically connecting the circuit to one or more of the connection posts are patterned over the dielectric substrate and through the corresponding via. The circuit can be micro-transfer printing from a circuit source wafer to the dielectric substrate. The sacrificial layer can be etched to release the micro-transfer printable component from the source wafer and the micro-transfer printable component micro-transfer printed to a destination substrate. The circuit can be an LED.

In another aspect, the disclosed technology includes a method of making a printable component, including: providing a forming substrate having two or more forms in a surface of the substrate; disposing a patterned layer of conductive material at least in the forms to make connection posts; disposing a first dielectric layer over the patterned layer of conductive material and the forming substrate; disposing a chiplet having chiplet contact pads on the first dielectric layer; forming conductors electrically connecting the connection posts to the chiplet contact pads; and defining the printable component to form a release layer and anchors in the forming substrate connected by tethers to the printable component. The first dielectric layer can be transparent.

In certain embodiments, the method includes providing a destination substrate having two or more substrate connection pads; and micro transfer printing the printable component to the destination substrate so that each connection post is in contact with, extends into, or extends through a substrate connection pad of the destination substrate to electrically connect the substrate connection pads to the connection posts and the printed component.

In certain embodiments, the method includes disposing a patterned second dielectric layer disposed at least partly over the first dielectric layer, the conductors, and the chiplet. In certain embodiments, the second dielectric layer is transparent, and the component is a light-emitting component that emits light through the second dielectric layer.

In another aspect, the disclosed technology includes a printable component, including: a first dielectric layer having connection posts protruding from the dielectric layer; a chiplet having a semiconductor substrate and chiplet contact pads, the chiplet disposed on the first dielectric layer; and conductors electrically connecting the connection posts to the chiplet contact pads.

In certain embodiments, the chiplet contact pads are located on a same side of the chiplet adjacent to the connection posts. In certain embodiments, the chiplet contact pads are located on a same side of the chiplet opposite to the connection posts.

In certain embodiments, the printable component includes a patterned electrical connection layer between the connection posts and the chiplet contact pads.

In certain embodiments, the adhesive material underfills the volume and applies compression between the printable component and the destination substrate.

In certain embodiments, the connection post has a height that is greater than its base width, a base width that is greater than its peak width, or a base area that is greater than its peak area.

The present invention provides structures and methods that enable the construction of electrical interconnections between small integrated circuits that are transfer printed on a destination substrate. The electrical interconnection process is simple and inexpensive requiring fewer process steps than known alternative methods.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 4 and 5 are cross sections illustrating steps in a method of the present invention;

FIG. 11 shows plan-view micrographs of printed electrical connection structures and test results according to embodiments of the present invention;

FIGS. 12-13 are tables with values describing test results for embodiments of the present invention;

Figure 1:
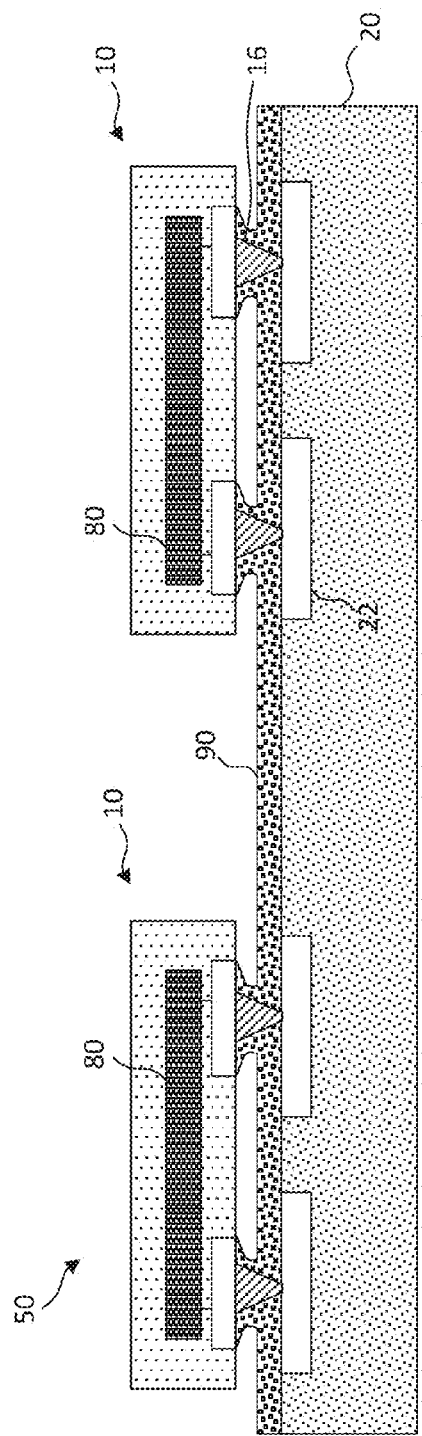
FIG. 1 is a cross section of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2:
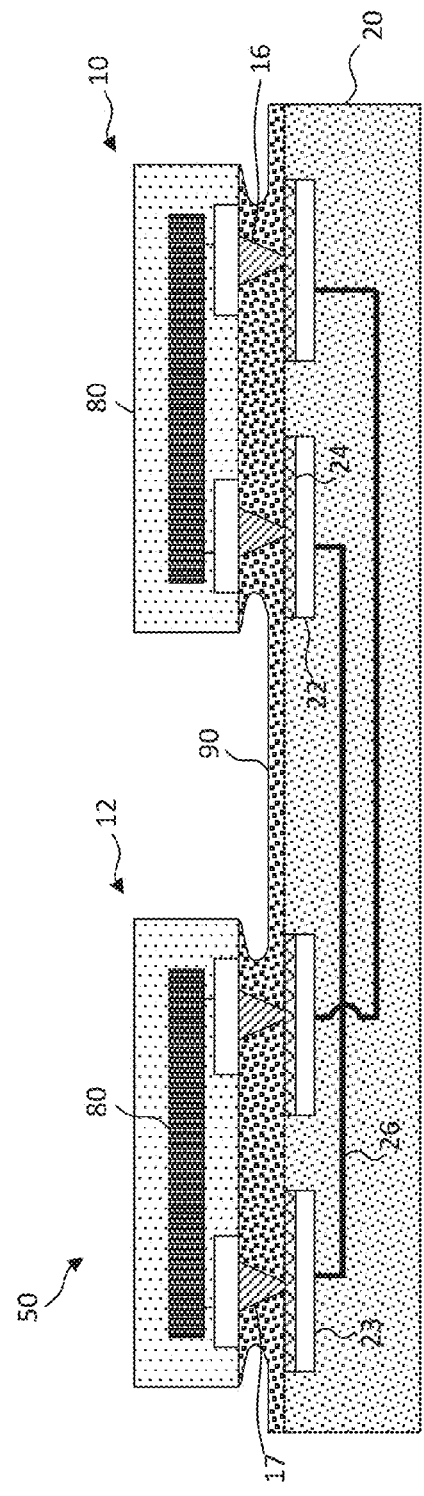
FIG. 2 is a cross section of another embodiment of the present invention having components electrically connected in parallel.

The present invention provides a structure and method for electrically connecting relatively small electrical components such as integrated circuit chiplets, LEDS, or electrical jumpers to a relatively large destination substrate in an efficient and cost-effective way. Referring to FIGS. 1 and 2 in an embodiment of the present invention, a printed electrical connection structure 50 includes a substrate 20 having one or more electrical connection pads 22 formed on or in the substrate 20. The connection pads 22 can be, for example metal backplane contact pads made using photolithographic methods, tools, and materials. The substrate 20 can be, for example, a printed circuit board or display substrate and can include glass, polymer, plastic, resin, or fiber glass.

A printed component 10 has a circuit 80 and one or more connection posts 16. The circuit 80 can be any structure responsive to, controlling, or conducting electrical energy supplied through the connection posts 16, such as an active circuit 80 including analog or digital circuits, a transistor, or an LED, or a passive circuit 80 including conductive wire, resistors, or capacitors. The printed component 10 can be an integrated circuit or include an integrated circuit on a component substrate separate from the integrated circuit and the substrate 80, for example a dielectric substrate 86 as discussed below with respect to FIG. 15. Each connection post 16 is in electrical contact with a connection pad 22. A resin 90 is disposed between and in contact with at least a portion of the substrate 20 and the printed component 10, for example in a patterned or an unpatterned layer. The resin 90 can be a curable polymer or epoxy. The resin 90 can be at least partly between two or more connection posts 16 and can be an adhesive. In an embodiment, a plurality of connection posts 16 and connection pads 22 are provided and each connection post 16 is electrically connected to at least one connection pad 22. In another embodiment two or more connection posts 16 are electrically connected to a common connection pad 22.

The resin 90 can have a disposed, deposited, or coated thickness that is less than a height of the connection posts 16, for example from the printed component 10 in a direction orthogonal to a surface of the printed component 10, as shown in FIGS. 1 and 2.

The resin 90 has a reflow temperature less than a cure temperature and the resin 90 repeatedly flows at the reflow temperature when temperature cycled between an operating temperature and the reflow temperature but will no any longer flow after the resin 90 is exposed to the cure temperature. By providing a resin 90 that repeatedly flows when heated to a reflow temperature less than a cure temperature, additional printed components 10 can be sequentially disposed, for example by micro-transfer printing, onto the substrate 20 and electrically connected to connection pads 22. The additional printed components 10 can be provided to replace or serve in the place of defective printed components 10 enabling improved yields for the printed electrical connection structure 50.

In a further embodiment of the present invention illustrated in FIG. 2, a solder 24 or other electrically conductive material is disposed on the connection post 16 (not shown), on the connection pad 22 (as shown) or on both the connection post 16 and the connection pad 22. The solder 24 is in electrical contact with both the connection post 16 and the connection pad 22. In various embodiments, the solder 24 has a melting temperature between the reflow temperature and the cure temperature, the solder 24 has a melting temperature less than or equal to the reflow temperature, or the solder 24 has a melting temperature greater than or equal to the cure temperature. The solder 24 can be patterned in a layer and can be disposed only on the connection pads 22 or connection posts 16. The connection pad 22 can include metal and the solder 24 can be softer than the connection pad 22 metal. Alternatively or in addition, the connection pad 22 and the connection post 16 both include metal and the metal of the connection pad 22 has a different hardness than the metal of the connection post 16. By providing elements with different hardness, electrical connections are more readily formed by mechanical pressure, such as that provided by micro-transfer printing.

As is also shown in FIG. 2, the reflowed resin 90 can substantially fill the space (volume) between the printed component 10 and the substrate 20 within the area defined or bounded by the connection posts 16, for example a convex hull defined by the connection posts 16 over the substrate 20. The resin can be in contact with the dielectric substrate 86 (FIG. 15, 16) of the printed component 10 and the substrate 20. By substantially fill the space is meant that at least 50%, 60%, 70%, 80%, 90%, 95%, or 99% of the volume is filled with resin 90. Alternatively, by substantially fill the space is meant that at least 50%, 60%, 70%, 80%, 90%, 95%, or 99% of the area of both the substrate 20 and printed component 10 defined or bounded by the connection posts 16, for example a convex hull defined by the connection posts 16 over the substrate 20 is covered by resin 90. Since, in an embodiment, the resin 90 can be deposited at a thickness less than the height of the connection posts 16, the space can be filled by reflowing the resin 90 so that it wicks over one or more surfaces of the printed component 10 between the printed component 10 and the substrate 10 to fill the space and reducing the amount of resin 90 in other areas over the substrate 20 that do not have a printed component 10. Thus, the resin 90 can have a greater thickness between the printed component 10 and the substrate 20 than at least some other areas of the substrate 20, as can be seen by comparing the thickness of the resin 90 in FIGS. 1 and 2.

Printed circuit board soldering techniques and materials can be used to provide the solder 24 on the connection pads 22. For example, the solder 24 can be a tin alloy. By providing the solder 24 with a desired melting temperature, the electrical connection between the connection pad 22 and the connection post 16 can be enhanced by flowing the solder 24 so that the solder 24 wicks along the surfaces of the connection pad 22 and the connection post 16.

In a further embodiment of the present invention and as illustrated in FIG. 2, the printed component 10 is a first printed component 10 and the one or more connection pads 22 are one or more first connection pads 22. A second printed component 12 has one or more second connection posts 17 and each second connection post 17 is in electrical contact with the second connection pads 23, for example using wires 26. The wires 26 can be made using printed circuit board or photolithographic methods, materials, and tools. The resin 90 is disposed between and in contact with the substrate 20 and the second printed component 12 and the first and second connection pads 22, 23 are electrically connected so that the first and second components 10, 12 are electrically connected in parallel. In an embodiment, the first component 10 is defective or otherwise fails to operate correctly and the second component 12 functions in the place of the defective component 10.

Figure 15:
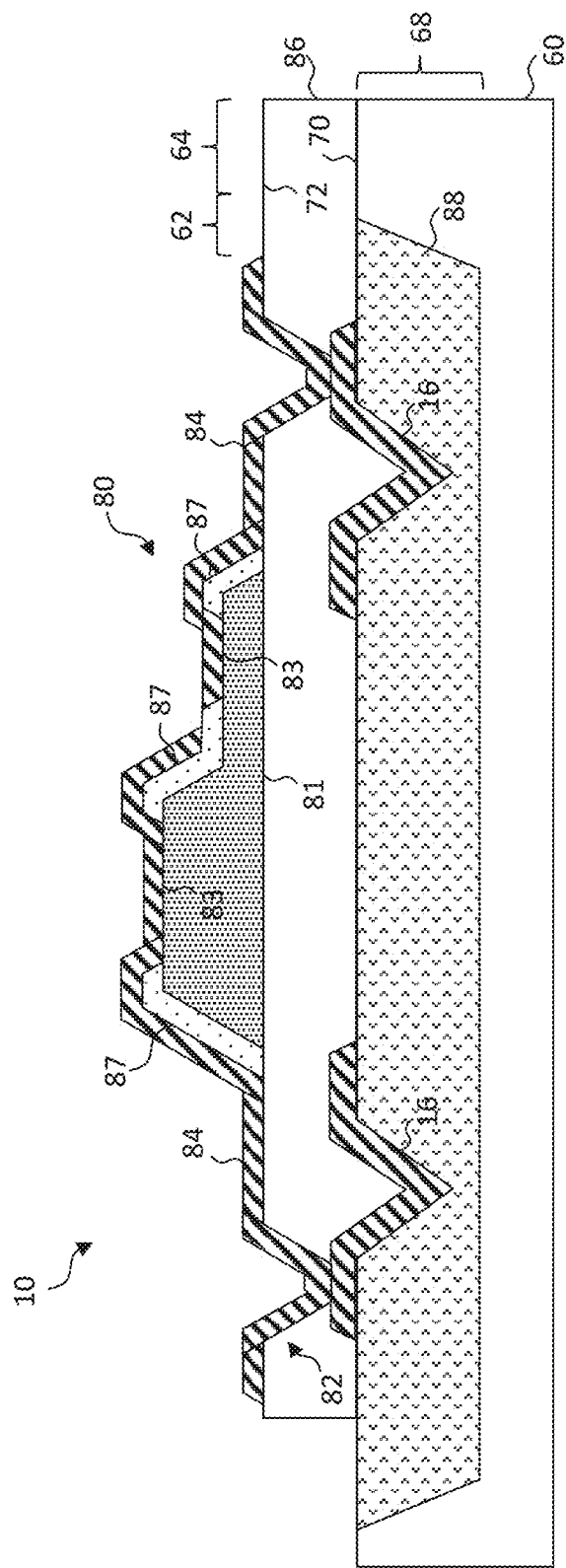
FIGS. 15 and 16 are cross sections of components according to embodiments of the present invention.
Figure 16:
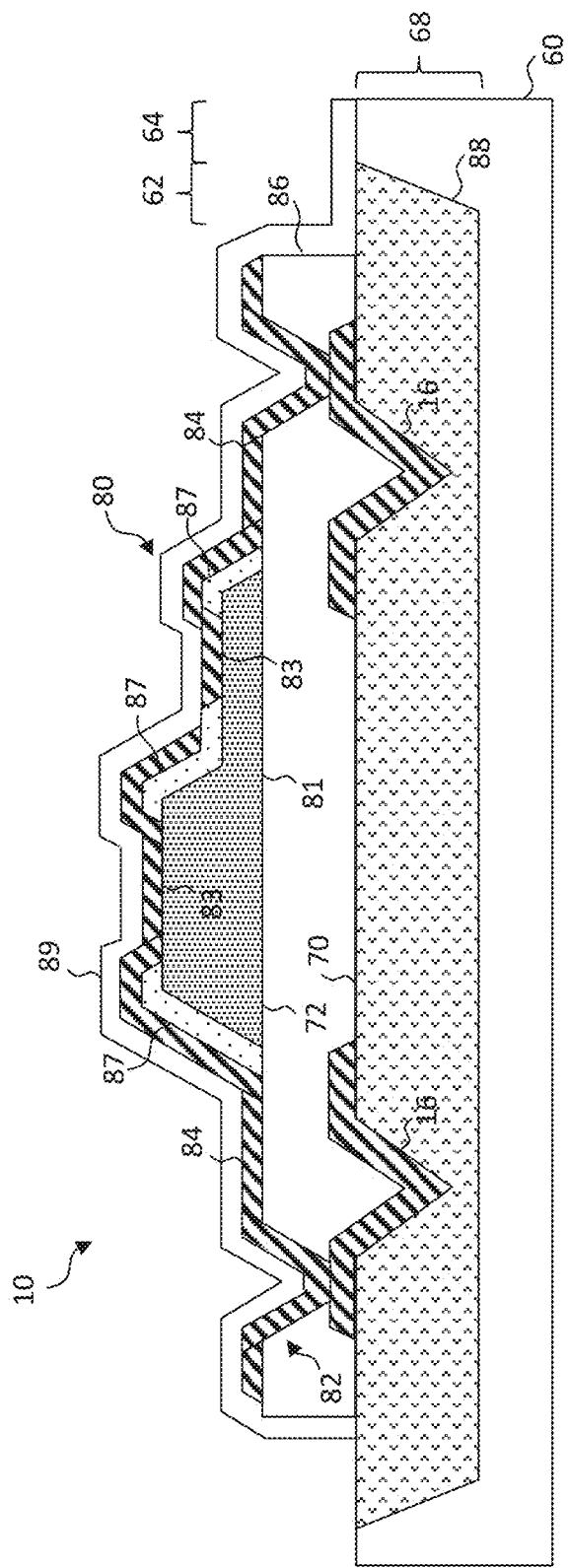

FIGS. 15 and 16 are examples of micro-transfer printable components 10 having a circuit 80 that includes a light-emitting diode (LED) 81 and electrodes 84. Connection posts 16 are formed on a sacrificial portion 88 of a patterned sacrificial layer 68 of a component source wafer 60 by etching a pyramidal structure into the sacrificial portion 88 and then patterning a conductive metal layer over the etched pyramidal structure. A dielectric substrate 86 such as silicon nitride is then deposited over the sacrificial layer 68 and connection posts 16. The connection posts 16 protrude from a post side 70 of the dielectric substrate 86. Vias 82 are formed in a circuit side 72 opposing the post side 70 of the dielectric substrate 86 over portions of the patterned conductive metal layer forming the connection posts 16. The LED 81 is disposed on the circuit side 72 of the dielectric substrate 86, for example by micro-transfer printing the LED 81 from an LED source wafer to the dielectric substrate 86. Patterned dielectric structures 87 are formed to insulate the edges of the LED 81 and expose LED contacts 83 on a common side of the LED 81 for supplying electrical power to the LED 81. The LED 81 can include multiple different layers such as conduction layers and emission layers electrically connected to the electrical contacts 83 and can emit light through an emission side of the LED 81 opposite the common side or through the common side. As shown in FIG. 16, the micro-transfer printable component 10 can have an encapsulation layer 89 comprising a patterned second dielectric layer to protect the component 10 and that can also serve as a tether 62 in addition to or in place of the patterned dielectric substrate 86. Thus, the tether 62 can have a thickness less than the thickness of the patterned dielectric substrate 86.

Patterned electrodes 84 are formed to electrically connect the LED contacts 83 to the connection posts 16 through the vias 82. Electrical power supplied through the connection posts 16 causes the LED 81 to emit light. Light can be emitted through the dielectric substrate 86 (as shown) or in a direction opposite to the dielectric substrate 86 (not shown), in which case the electrodes 84 do not cover the LED 81 common side and a reflective layer can be located on the opposite side. Alternatively, the LED contacts 83 can be located on a common side of the LED 81 adjacent to the circuit side 72 of the dielectric substrate 86 (not shown). Etching the patterned sacrificial portion 88 (formed on or in the surface of the component source wafer 60) forms a space beneath the component 10 with tethers 62 physically connecting the component 10 to an anchor area 64 of the component source wafer 60 and releases the micro-transfer printable component 10 from the component source wafer 60 so that the component 10 can be micro-transfer printed, for example to a destination substrate 20 (FIG. 1).

Forming the patterned sacrificial layer 68 and the pyramidal structures, patterning the conductive metal layer to form connection posts 16, depositing the dielectric substrate 86, forming the vias 82 in the dielectric substrate 86, patterning the dielectric structures 87, and depositing and patterning the electrodes 84 can all be done using photolithographic material deposition and patterning techniques. The sacrificial portion 88 of the patterned sacrificial layer 68 can be a designated portion of an anisotropically etchable material such as silicon <100> oriented crystalline silicon or a different material. Alternatively, the dielectric substrate 86 can be an oxide layer such as silicon dioxide or a nitride layer such as silicon nitride. The electrodes 84 can be made of conventional electrically conductive integrated circuit materials, including aluminum, silver, titanium, copper, or other metals or metal alloys, as can the connection posts 16 and connection pads 22.

Methods of forming micro-transfer printable structures are described further, for example, in the paper "AMOLED Displays using Transfer-Printed Integrated Circuits". For a discussion of micro-transfer printing techniques see, U.S. Pat. Nos. 8,722,458, 7,622,367 and 8,506,867, each of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled Compound Micro-Assembly Strategies and Devices, which is hereby also incorporated by reference in its entirety. In an embodiment, the component 10 is a compound micro-assembled structure.

Figure 3:
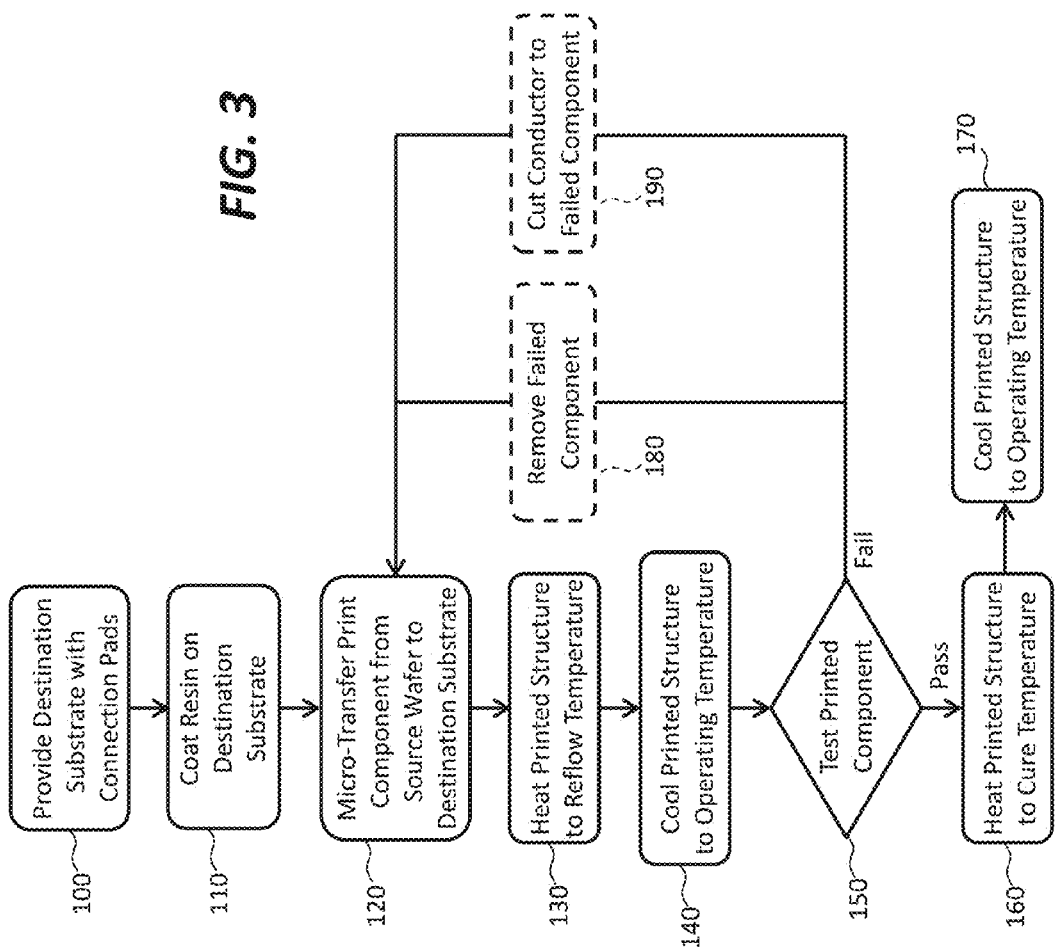
FIG. 3 is a flow diagram illustrating a method of the present invention.

Referring to FIG. 3 according to an embodiment of the present invention, a method of making a printed electrical connection structure 50 includes providing a substrate 20 having one or more electrical connection pads 22 in step 100. In step 110 a resin 90 is disposed over the substrate 20 over and in contact with at least a portion of the substrate 20, for example on the connection pads 22 in a patterned or unpatterned layer. One or more components 10 are micro-transfer printed in step 120 from a component source wafer 60 to the destination substrate 20 as shown in FIGS. 4, 5, and 15, for example using a micro-transfer stamp 30 having a pillar 32 in contact with each component 10. Each component 10 has one or more connection posts 16 that are each positioned adjacent to a corresponding connection pad 22 so that the resin 90 is contacted to at least a portion of the printed component 10, such as the connection posts 16. A connection post 16 is adjacent to a connection pad 22 if no other connection pad 22 is closer to the connection post 16 than the connection pad 22. The connection post 16 can be, but is not necessarily, in contact with the connection pad 22 after the micro-transfer printing step 120, as shown in FIG. 5. The stamp 30 can then be removed.

The printed electrical connection structure 50 is heated to the resin 90 reflow temperature in step 130. In response, the resin 90 at least partially liquefies and wicks along surfaces with which it is in contact, such as the connection pads 22, the substrate 20, the connection posts 16 and optionally portions of the printed component 10 such as a semiconductor layer or component substrate such as the dielectric substrate 86 (FIG. 15, 16 below). The wicking process reduces the space between the component 10 and the substrate 20 so that the component 10 and the substrate 20 are drawn closer together in compression and the connection posts 16 and the connection pads 22 are forced into electrical contact (FIGS. 1 and 2). If a solder 24 layer is present (FIG. 2), the solder 24 can also flow and facilitate electrical connection between the connection post 16 and the connection pad 22. Furthermore, the wicking process can increase the volume of material The printed electrical connection structure 50 can be cooled to an operating temperature, such as room temperature in step 140 and functionally tested (step 150), for example electrically tested by providing or receiving electrical signals on the connection pads 22 that operate the printed component 10. If the components 10 can be tested without reflowing the resin 90, steps 130 and 140 can be skipped. In a test, for example, if the printed component 10 is an LED, light output can be observed or current through or voltage across the component 10 or circuit 80 measured. If the printed component 10 passes the test, the printed electrical connection structure 50 is heated to the cure temperature (step 160), the resin 90 is cured, and the printed electrical connection structure 50 cooled again in step 170 (as in step 140) and can be placed into operation.

If, however, the printed component 10 fails the test in step 150, it is optionally removed in step 180. A second component 12 (FIG. 2) is printed either in the location of the defective component 10 or onto second connection pads 23 that are electrically connected in parallel to the first connection pads 22 of the defective component 10. The process continues as described above and the resin 90 is repeatedly reflowed until a component 10 passes the test and a good component 10 is operational. Once the resin 90 is cured, it can no longer reflow at the reflow temperature and the process is concluded.

According to an embodiment of the present invention, the micro-transfer printing step 120 transfers a plurality of components 10 in a single step. The components 10 can be tested in a common step 150 or all of the components 10 tested before the additional components 10 are printed. Most of the components 10 are functional and the process of repeatedly reflowing the resin 90 does not destroy the electrical connections between the connection posts 16 and the connection pad 22 of the good components 10 once the electrical connections between the connection posts 16 and the connection pad 22 are made.

In a further embodiment of the present invention a conductor to the failed or defective component 10 is optionally cut in step 190. In the case in which the component 10 is electrically shorted, for example, it is useful to remove the defective component 10 from the electrical circuit on the substrate 20 to prevent shorts between power signals and ground signals and consequent power waste. This can be accomplished by cutting a power or ground line connection (e.g., wire 26) to the defective or failed component 10. Lasers can pattern-wise cut electrical wires or traces on a backplane, substrate, or circuit boards to electrically isolate defective components 10. The wires 26 can be cut before or after additional components 10 are micro-transfer printed in step 120 or before or after the resin 90 is cured in step 160.

Figure 6:
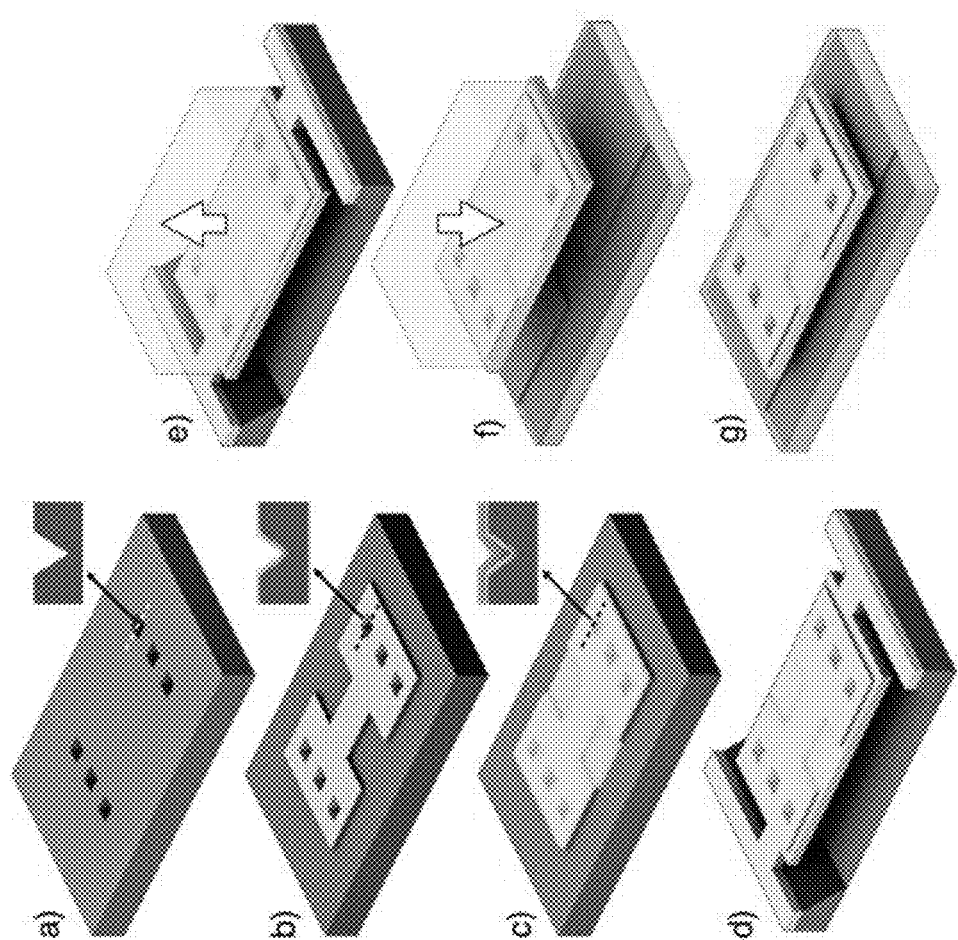
FIG. 6 is a perspective illustrating steps in a method of the present invention.

FIG. 6 illustrates the methodology employed for making pressure-concentrating conductive connection posts 16 within releasable components 10 that can then be interconnected into systems using elastomer stamp micro-transfer printing. Silicon wafers provide a convenient template for making high-fidelity structures by wet-etching. Small inverted-pyramid cavities are formed in <100> oriented crystalline silicon wafers using a silicon nitride hard-mask combined with anisotropic wet-etching with tetramethylammonium hydroxide (TMAH). The silicon nitride hard-mask is removed and a titanium-capped gold film (400 nm Au/50 nm Ti) is deposited and patterned. In one embodiment, the deposited metal layers are designed to form redistribution structures, like the dog-bone pattern in FIG. 6(b), such that the component 10 becomes a passive electrical "jumper". A dielectric layer, in this case silicon nitride deposited by plasma-enhanced chemical vapor deposition (PECVD), is deposited and patterned to form the mechanical backbone of the component 10. A second layer of PECVD silicon nitride is then deposited and patterned to form the final component 10 structure, including anchors 64 and tethers 62. The silicon underneath the component 10 is then removed by heated TMAH. The silicon directly underneath the anchor 64 region is not etched due to the nature of the anisotropic etch. Following this release etch process, the components 10 remain fixed to the component source wafer 60 through the silicon nitride tethers 62 that exist between the component 10 and the anchor 64. FIGS. 6(e) and 6(f) shows the component 10 being retrieved and then micro-transfer printed to a target substrate. In FIG. 6(g), the polymer layer on the target is reflowed and the device is interconnected to the underlying metal traces.

Figure 8:
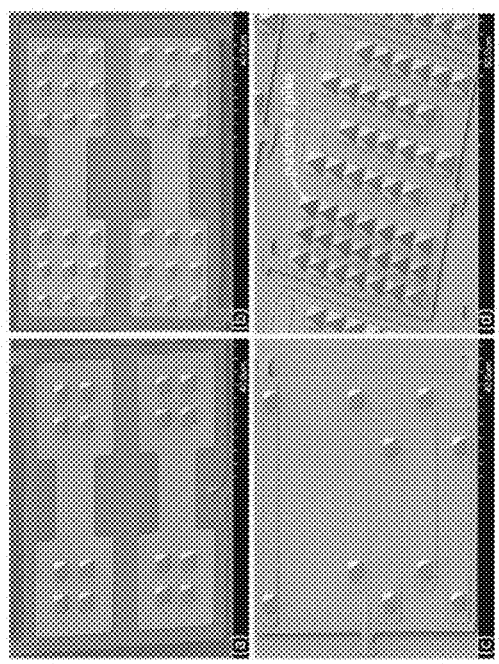
FIGS. 7-8 are plan-view micrographs of components according to embodiments of the present invention.
Figure 7:
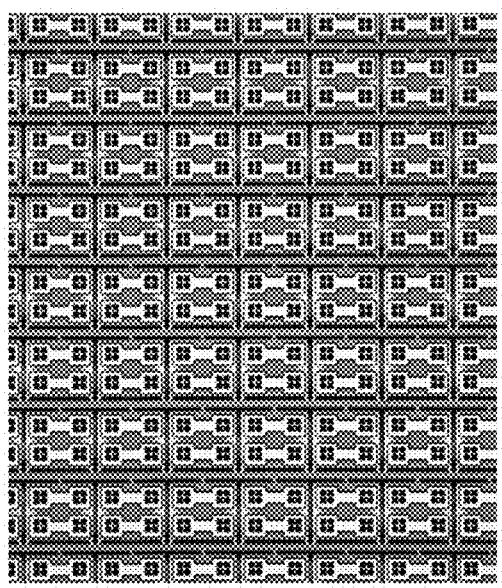

FIG. 7 is an optical micrograph of undercut jumper components 10 on their silicon component source wafer 60. These components 10 have two independent metal dog-bones and each interconnection site has a 2×2 array of the pressure-concentrating connection posts 16. The process features wide design latitude. Examples of different jumper designs are shown in FIG. 8. In these images, the components 10 are flipped, with the connection posts 16 pointing up. FIG. 8(d) shows a design that includes electrically insulating connection posts 16 which can be useful for mechanical supports or other non-electrical functions.

The released components 10 are now ready for integration into a non-native system using micro-transfer-printing. A viscoelastic elastomer stamp 30 is designed and fabricated to retrieve and transfer arrays of the components 10 from their native component source wafer 60 onto non-native application substrates 20. The stamp 30 mounts onto motion-plus-optics machinery that can precisely control the stamp 30 alignment and kinetics. During the printing, the machinery brings the stamp 30 into contact with the component source wafer 60, with optical alignment performed before contact. FIG. 6(e) illustrates a single elastomer pillar 32 laminated against a single component 10. Rapid upward movement of the print-head fractures the tether 62, transferring the component 10 to the stamp 30. The populated stamp 30 then transits to the destination substrate 20 and the components 10 are then aligned to the connection pads 22 and printed.

In a demonstration and according to an embodiment of the present invention, the destination substrates 20 are glass wafers with metal wires 26. The wires 26 on the glass wafers were patterned using lift-off techniques and were comprised of electron-beam deposited Au (~400 nm) with a Ti adhesion layer (~100 nm). A layer of planarizing polymer resin 90 (Dow Chemical Intervia 8023) such as an epoxy is applied to the destination substrate 20 before printing. Here the thickness of the layer of resin 90 was targeted to be 2.3 μm.

During printing, the populated stamp 30 contacts the components 10 to the destination substrate 20, the connection pads 22, or the resin 90. During this step, the gold-coated connection posts 16 penetrate the layer of resin 90, as seen in FIG. 2 discussed above and FIG. 10 discussed below. The stamp 30 is able to apply additional penetration force by overdriving the stamp 30 in the z-direction past the original contact position. Controlled upward and lateral stamp motions allow the stamp 30 to transfer the components 10 to the destination substrate 20.

Following the transfer-printing, the samples undergo a hotplate bake (140° C.) where the polymer resin 90 flows under the component 10. After system assembly is complete the samples are fully cured at 175° C. for three hours under flowing nitrogen.

Figure 9:
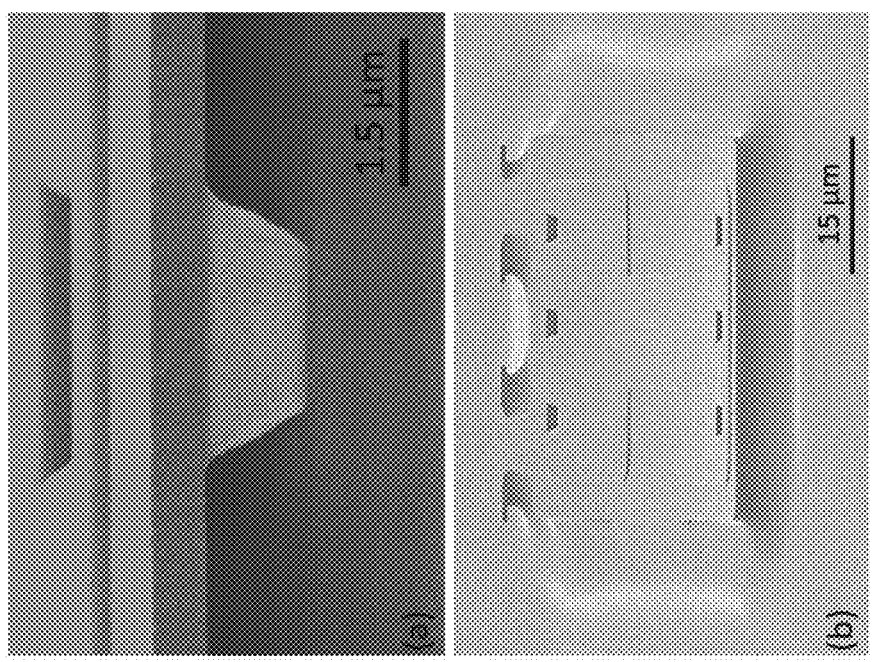
FIG. 9 shows perspective micrographs of a connection post and a component according to embodiments of the present invention.

This process uses stress-concentrating conductive connection posts 16 in conjunction with an underfill resin 90 to realize interconnected systems that do not require metallization steps after assembly. By underfill is meant that the resin 90 does not fill the volume between the printed component 10 and the destination substrate 20. Furthermore, with a heat treatment provided after disposing the resin 90, the resin 90 shrinks and provides compression between the printed component 10 and the destination substrate 20 to further strengthen and make robust the electrical connections between the connection posts 16 and the substrate connection pads 22. FIG. 9(a) is a scanning electron micrograph, taken after printing, showing the penetration of a connection post 16 into the planarized resin 90 present on the destination substrate 20. Reliable electrical connection typically requires reflow of the resin 90. Despite penetration of the connection posts 16 into the resin 90 during the printing step, some of the connection posts 16 and connection pads 22 are not electrically connected until the reflow process (step 130, FIG. 3). The post-print 140° C. treatment serves to reflow the polymer resin 90. During reflow the polymer resin 90 wicks under the components 10, as shown in FIG. 9(b), and capillary action forces the connection posts 16 of the components 10 into contact with the underlying metal traces of the connection pads 22. Measurement of the printed electrical connection structure 50 shows electrical continuity following the reflow process. After system assembly is complete, the underfill resin 90 is fully cured (step 160, FIG. 3).

Figure 10:
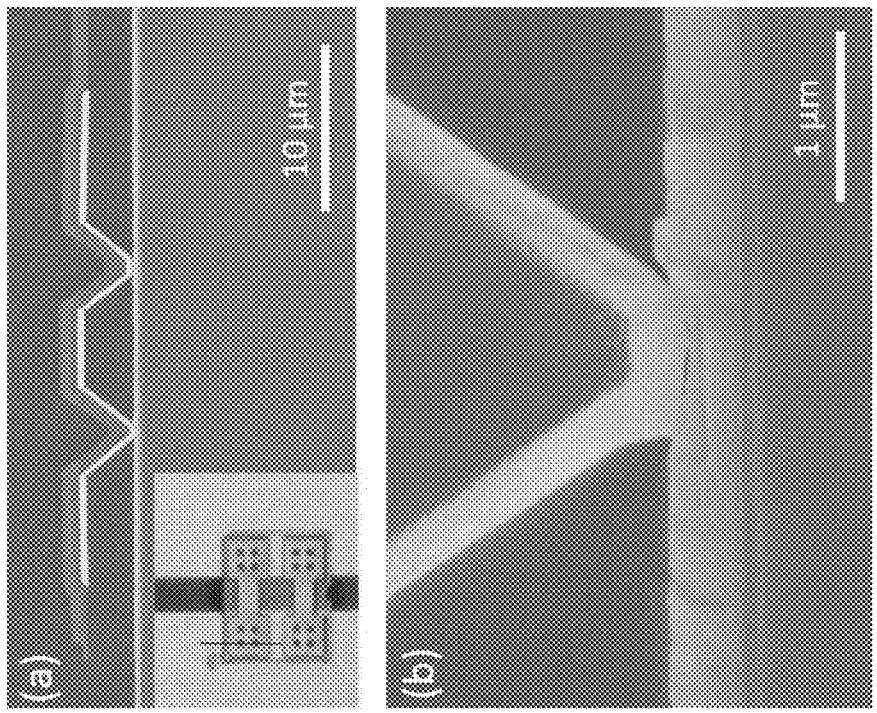
FIG. 10 shows cross-section micrographs of connection posts at two resolutions according to embodiments of the present invention.

Thickness measurements (Nanospec 210) on blanket films of resin 90 indicate that unconstrained films of resin 90 shrink in excess of 17% during the hard cure (step 160, FIG. 3). The shrinkage of the resin 90 pulls the component 10 toward the destination substrate 20, which further drives the connection posts 16 into the connection pad 22. Scanning electron micrographs of cross-sectioned samples are shown in FIG. 10. The cross-section location is marked by the line in the top-down optical micrograph shown in FIG. 10(a). The higher magnification micrograph, FIG. 10(b), in the vicinity of the connection post 16 tip, reveals that the gold-coated connection post 16 makes intimate contact with and penetrates some depth into the connection pad 22.

Embodiments of the present invention using electrically conductive jumper components 10 were tested. Daisy chain test circuits provide a convenient platform to study the performance and reliability of the pressure-activated interconnecting components 10. FIG. 11(a) shows a target landing site designed to accommodate a jumper component 10 with ten independent interconnection sites. FIG. 11(b) shows the same site after integration of the jumper component 10. In this case, each interconnection is made by a single inverted-pyramid conductor. The 400 nm thick gold landing traces are 10 μm wide. This embodiment demonstrates an interconnect pitch of 15 μm in the y-direction.

The daisy chain is designed to accept a 20×20 array of jumper components 10 in a single transfer-print operation. The pitch between the printed jumper component 10 is 500 μm. A micrograph of the full daisy-chain test vehicle is shown in FIG. 11(c). Two-wire resistance measurements with an ohmmeter (Fluke 45) are shown in FIG. 11(d) and the table of FIG. 12. In this example, the resistance per jumper component 10 is approximately 5.7 Ohms. These printed electrical connection structures 50 have ten independent interconnects, which indicates a resistance per interconnect of 0.57 Ohms, including the resistance of the wires 26 and the contact resistance of the interconnection.

Fully interconnected daisy chains have been subjected to numerous reliability tests. The table of FIG. 13 shows the resistance changes of a full chain with 1120 interconnections that was subjected to thermal shock and pressure humidity testing. Elevated temperature and mechanical tests were also performed. The interconnected devices exhibit remarkable resilience to harsh stressors. This is likely due in part to the micro-scale nature of the integrated elements and also to the inherent ability for this process to underfill the components 10.

Figure 14:
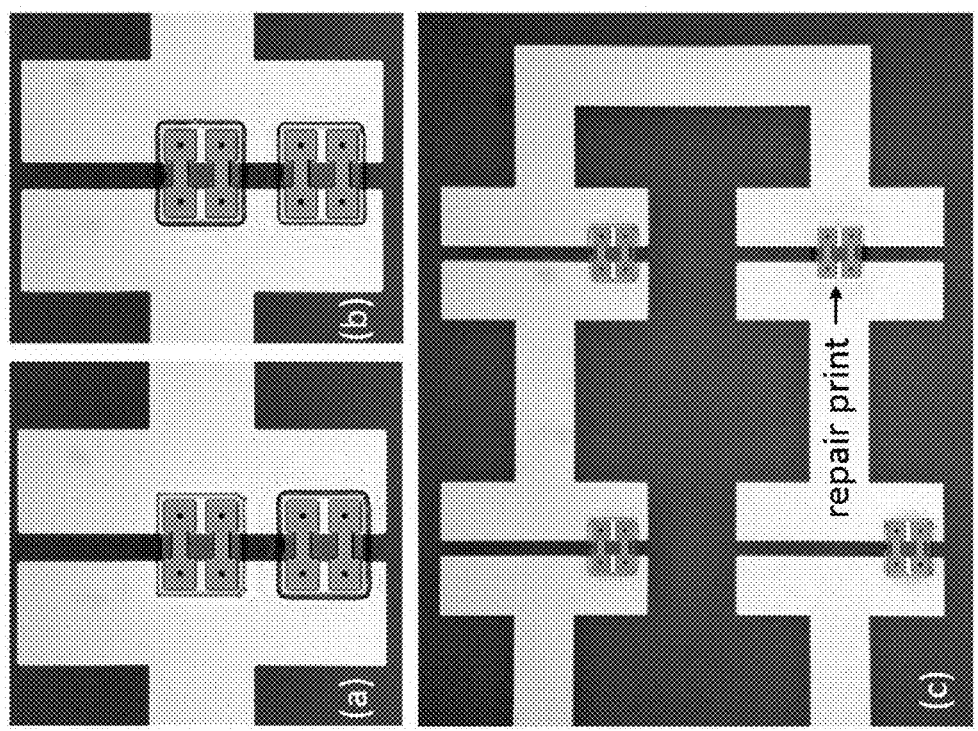
FIG. 14 shows plan-view micrographs of printed electrical connection structures according to an embodiment of the present invention.

A compelling attribute of the present invention is the ability to repair defects after system-level testing (step 150, FIG. 3). As discussed above, the printed electrical connection structures 50 are electrically interconnected and testable following the reflow (step 130, FIG. 3) of the underfill resin 90. Even though the resin 90 flows, it remains largely unchanged after returning to room temperature. Thickness measurements on blanket films of polymer resin 90 show a ~2% thickness reduction following a reflow process (140° C., 4 min), which is mostly attributed to further evaporation of the carrier solvent. The polymer resin-coated destination substrate 20 remains receptive to repeated transfer-prints (step 120, FIG. 3) following a first print, reflow and test sequence, see FIG. 14(*a*) and FIG. 14(*b*). In FIG. 14(*a*), the upper device was printed after a first print and reflow cycle to show that the resin remains receptive to additional prints after reflow. FIG. 14(*b*) shows the same site following a second reflow, indicating the resin wicks into the secondary device. An example of a repaired series chain is shown in FIG. 14(*c*).

Another important attribute of the present invention is the ability to efficiently provide a micro-transfer printed display, test, and repair process. A very large number of micro-LEDs can be micro-transfer printed in the initial construction process (e.g., more than 1,000 micro-LEDs per print, more than 10,000 micro-LEDs per print, more than 50,000 micro-LEDs per print, or more than 100,000 micro-LEDs per print) so that large, high-resolution displays can be printed in only a few minutes. All of the devices can be electrically interconnected in a common photolithographic step (or as part of the micro-transfer printing process using connection posts) and tested in a common test step, for example using an optical test fixture with image analysis. Failed devices can then be removed or disconnected using a high-speed laser system or repair devices installed using a single or multiple print-head micro-LED micro-transfer printing system.

Conventional silicon micromachining by anisotropic wet-etching provides convenient routes to the fabrication of metal-coated pyramidal connection posts 16 that can be integrated within fully undercut micro-transfer-print compatible components 10. The soft elastomer stamps 30 employed in micro-transfer-printing can provide the down force required for the connection posts 16 to penetrate into a resin 90 underfill. Reflow of the underfill layer of polymer resin 90 drives completion of the electrical interconnection through capillary forces. A simple demonstration showed how the interconnection strategy can be used for repair after electrical test of the printed electrical interconnection structure 50.

Some applications of the present invention can benefit from strategies that complete the device interconnections in combination with the assembly process. Examples include large-format or mechanically flexible applications where it is not convenient to perform traditional lithography and metallization processes following the system assembly.

The component 10 can be an active component, for example including one or more active elements such as electronic transistors or diodes or light-emitting diodes and photodiodes that produce an electrical current in response to ambient light. Alternatively, the component 10 can be a passive component, for example including one or more passive elements such as resistors, capacitors, or conductors. In another embodiment, the component 10 is a compound component 10 that includes both active and passive elements. The component 10 can be or include a semiconductor device having one or more semiconductor layers, such as an integrated circuit. The component 10 can be or include an unpackaged die. In yet another embodiment, the component 10 is a compound element having a plurality of active or passive elements, such as multiple semiconductor devices with separate substrates, each with one or more active elements or passive elements, or both. In certain embodiments, the plurality of elements is disposed and interconnected on a compound component substrate (e.g., dielectric substrate 86) separate and independent from the substrates of any semiconductor devices. The compound component 10 can be micro transfer printed itself after the elements have been arranged thereon. The components 10 can be electronic processors, controllers, drivers, light-emitting diodes, photodiodes, light-control devices, or light-management devices.

The components 10 made by methods of the present invention can include or be a variety of chiplets having semiconductor structures, including a diode, a light-emitting diode (LED), a transistor, or a laser. Chiplets are small integrated circuits and can be unpackaged dies released from a source wafer and can be micro transfer printed. Chiplets can have at least one of a width, length, and height from 2 to 5 µm, 5 to 10 µm, 10 to 20 µm, or 20 to 50 µm. Chiplets can have a doped or undoped semiconductor substrate thickness of 2 to 5 µm, 5 to 10 µm, 10 to 20 µm, or 20 to 50 µm or can have glass, polymer, oxide, or nitride substrates. The chiplet or components 10 can include micro-light-emitting diodes with a length greater than width, for example having an aspect ratio greater than or equal to 2, 4, 8, 10, 20, or 50 and component contact pads (e.g., contacts 83) that are adjacent to the ends of the printable semiconductor components 10 along the length of the printable semiconductor components 10. This structure enables low-precision manufacturing processes to electrically connect wires 26 to the component contact pads without creating registration problems and possible unwanted electrical shorts or opens.

The components 10 can include active elements such as electronic circuits 80 formed using lithographic processes and can include passive elements such as electrical connections, e.g., wires, connecting the component contact pads and connection posts 16. In certain embodiments, the component contact pads 83 are planar electrical connections. Such component contact pads can be formed from metals such as aluminum or polysilicon using various masking and deposition processes.

In some embodiments of the present invention, the components 10 are or include small integrated circuits, for example chiplets, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such chiplet or component 10 can be made in a source semiconductor wafer (e.g., a silicon or GaN wafer) having a process side and a back side used to handle and transport the wafer. Chiplets, components 10, or portions of components 10 are formed using lithographic processes in an active layer on or in the process side of the source wafer. An empty release layer space is formed beneath the components 10 with tethers connecting the components 10 to the source wafer in such a way that pressure applied against the components 10 breaks the tethers to release the components 10 from the source wafer. Lithographic processes can be used to form components 10 in a source wafer, for example transistors, wires, and capacitors.

According to various embodiments of the present invention, the component source wafer 60 can be provided with the components 10, patterned sacrificial layer 68, tethers 62, and connection posts 16 already formed, or they can be constructed as part of the process of the present invention.

Connection posts 16 are electrical connections formed on the component 10 that extend generally perpendicular to a surface of the component 10. Such connection posts 16 can be formed from metals such as aluminum, titanium, tungsten, copper, silver, gold, or other conductive metals. The connection posts 16 can be formed by repeated masking and deposition processes that build up three-dimensional structures. Alternatively, the connection posts 16 can be made by etching one or more layers of metal evaporated or sputtered on the process side of the component 10. Such structures can also be made by forming a layer above or below the component 10 surface (e.g., the patterned sacrificial layer 68), etching a well into the layer, filling it with a conductive material such as metal, and then removing the layer. The connection posts 16 are then electrically connected to contact pads in the component 10. In some embodiments, the connection posts 16 are made of one or more high elastic modulus metals, such as tungsten. As used herein, a high elastic modulus is an elastic modulus sufficient to maintain the function and structure of the connection post 16 when pressed into a substrate connection pad 22.

The connection posts 16 can have a variety of aspect ratios and typically have a peak area smaller than a base area. The connection posts 16 can have a sharp point for embedding in or piercing the substrate connection pads 22. The connection posts 16 can have a base width representing a planar dimension of the connection post 16 on the process side and a height representing the extent of the connection post 16 from the process side to the peak of the connection post 16. The peak of the connection post 16 can have a width less than base width and, in an embodiment, approaches zero so that the connection post 16 has a sharp point. The base of the connection post 16 can have a base area in contact with the process side and a peak area smaller than the base area. The connection post 16 can also have a height greater than a base dimension.

In an embodiment, the connection post 16 is softer than the connection pad 22 so that the connection post 16 can crumple when the connection post 16 is under mechanical pressure. Alternatively, the connection pad 22 is softer than the connection post 16 so that it deforms before the connection post 16 when under mechanical pressure. By deform is meant that the connection posts 16 or the substrate connection pads 22 change shape as a consequence of the transfer printing.

The substrate connection pads 22 can be made of a relatively soft metal, such as tin, solder, or tin-based solder, to assist in forming good electrical contact with the connection posts 16 and adhesion with the components 10. As used herein, a soft metal may refer to a metal into which a connection post 16 can be pressed to form an electrical connection between the connection post 16 and the substrate connection pad 22. In this arrangement, the substrate connection pad 22 can plastically deform and flow under mechanical pressure to provide a good electrical connection between the connection post 16 and the substrate connection pad 22. In another embodiment of the present invention, the connection posts 16 can include a soft metal and the substrate connection pads 22 include a high elastic modulus metal. In this arrangement, the connection posts 16 can plastically deform and flow under mechanical pressure to provide a good electrical connection between the connection post 16 and the substrate connection pads 22.

The layer of resin 90 can be cured to more firmly adhere the components 10 to the destination substrate 20 and maintain a robust electrical connection between the connection posts 16 and substrate connection pads 22 in the presence of mechanical stress. The adhesive resin 90 can undergo some shrinkage during the curing process that can further strengthen the electrical connectivity and adhesion between the connection post 16 and the substrate connection pads 22.

In alternative embodiments of the present invention, the connection posts 16 of the components 10 are in contact with, are embedded in, or pierce the substrate connection pads 22 of the destination substrate 20. Alternatively, deformation or crumpling of the connection pads 22 or connection posts 16 can improve the electrical connection between the connection posts 16 and the substrate connection pads 22 by increasing the surface area that is in contact with the connection posts 16 and the substrate connection pads 22. To facilitate deformation, in an embodiment the two or more connection posts 16 have a composition softer than that of the substrate connection pads 22 or the substrate connection pads 22 have a composition softer than the connection posts 16.

A compliant polymer layer can be formed beneath the substrate connection pads 22 to facilitate the mechanical contact made when the connection posts 16 are embedded in the backplane connection pads 22. For example, a metal or metal alloy containing as gold, tin, silver, or aluminum, can be formed over a polymer layer or a polymer layer coated over a metal or metal alloy containing gold, tin, silver, or aluminum. The compliant polymer layer can also serve to adhere the connection posts 16 to the substrate connection pads 22.

In an embodiment two or more connection posts 16 are electrically shorted in a component 10 and electrically connected to a common substrate connection pad 22. Such redundant electrical connections reduce contact failures between the connection posts 16 and the substrate connection pads 22, for example as shown in FIG. 8.

The spatial distribution of the components 10 is a matter of design choice for the end product desired. In one embodiment of the present invention, all of the components 10 in a component source wafer array are transferred to the stamp 30. In another embodiment, a subset of the components 10 in the component source wafer array is transferred. By varying the number and arrangement of pillars 32 on transfer stamps 30, the distribution of components 10 on the pillars 32 of the transfer stamp 30 can be likewise varied, as can the distribution of the components 10 on the destination substrate 20.

In an embodiment of the present invention, the component 10 is a light-emitting component 10 that emits light in a direction opposite to the connection posts 16 or in a direction of the connection posts 16.

According to one embodiment of the present invention, a source wafer can be provided with components 10 and connection posts 16 already formed. Alternatively, an unprocessed source wafer can be provided and the components 10 formed on the component source wafer 60. An unprocessed source wafer is a substrate that does not yet include components 10. The unprocessed source wafer can have other processing steps completed, for example, cleaning, deposition of material layers, or heat or chemical treatments. Components 10 are formed, for example using photo-lithographic processes including forming masks over the source wafer, etching materials, removing masks, and depositing materials.

Components 10 can be or include small electronic integrated circuits, inorganic light-emitting diodes, or electrical connectors (jumpers) for example, having a size of about 5 microns to about 5000 microns in a dimension. The electronic circuits 80 can include semiconductor materials (for example inorganic materials such as silicon or gallium arsenide, or inorganic materials) having various structures, including crystalline, microcrystalline, polycrystalline, or amorphous structures. In another embodiment, the components 10 are passive, for example including a conductor that, when used in a printed electrical connection structure 50 serves to electrically connect one conductor (e.g., a substrate connection pad 22) to another, forming a jumper. The components 10 can also include insulating layers and structures such as silicon dioxide, nitride, and passivation layers and conductive layers or structures including wires made of aluminum, titanium, silver, or gold that form an electronic circuit 80. Large numbers of such small integrated circuits can be formed on a single source wafer. The components 10 are typically packed as closely as possible to use the surface area of the source wafer as efficiently as possible.

In some embodiments, the components 10 are or include small integrated circuits formed in a semiconductor wafer, for example gallium arsenide or silicon, which can have a crystalline structure. Processing technologies for these materials typically employ high heat and reactive chemicals. However, by employing transfer technologies that do not stress the component 10 or substrate materials, more benign environmental conditions can be used compared to thin-film manufacturing processes. Thus, the present invention has an advantage in that flexible substrates, such as polymeric substrates, that are intolerant of extreme processing conditions (e.g. heat, chemical, or mechanical processes) can be employed for the destination substrates 20. Furthermore, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Alternatively, the components 10 can be formed in a microcrystalline, polycrystalline, or amorphous semiconductor layer.

The components 10 can be constructed using foundry fabrication processes. Layers of materials can be used, including materials such as metals, oxides, nitrides and other materials. Each component 10 can be or include a complete semiconductor integrated circuit and can include, for example, transistors, diodes or light-emitting diodes. The components 10 can have different sizes, for example, 1000 square microns or 10,000 square microns, 100,000 square microns, or 1 square mm, or larger, and can have variable aspect ratios, for example 1:1, 2:1, 5:1, or 10:1. The components 10 can be rectangular or can have other shapes.

Embodiments of the present invention provide advantages over other printing methods described in the prior art. By employing connection posts 16 on components 10 and a printing method that provides components 10 on a destination substrate 20 connection posts 16 in contact with the destination substrate 20 or layers formed on the destination substrate 20, a low-cost method for printing components 10 in large quantities over a destination substrate 20 is provided. Furthermore, additional process steps for electrically connecting the components 10 to the destination substrate 20 are obviated.

The source wafer and components 10, transfer stamp 30, and destination substrate 20 can be made separately and at different times or in different temporal orders or locations and provided in various process states.

The method of the present invention can be iteratively applied to a single or multiple destination substrates 20. By repeatedly transferring sub-arrays of components 10 from a transfer stamp 30 to a destination substrate 20 and relatively moving the transfer stamp 30 and destination substrates 20 between stamping operations by a distance equal to the spacing of the selected components 10 in the transferred sub-array between each transfer of components 10, an array of components 10 formed at a high density on a component source wafer 60 can be transferred to a destination substrate 20 at a much lower density. In practice, the component source wafer 60 is likely to be expensive, and forming components 10 with a high density on the component source wafer 60 will reduce the cost of the components 10, especially as compared to forming circuits on the destination substrate 20. Transferring the components 10 to a lower-density destination substrate 20 can be used, for example, if the components 10 manage elements distributed over the destination substrate 20, for example in a display, digital radiographic plate, or photovoltaic system.

In particular, in the case wherein the active component 10 is or includes an integrated circuit formed in a crystalline semiconductor material, the integrated circuit substrate provides sufficient cohesion, strength, and flexibility that it can adhere to the destination substrate 20 without breaking as the transfer stamp 30 is removed.

In comparison to thin-film manufacturing methods, using densely populated component source wafers 60 and transferring components 10 to a destination substrate 20 that requires only a sparse array of components 10 located thereon does not waste or require active layer material on a destination substrate 20. The present invention can also be used in transferring components 10 made with or including crystalline semiconductor materials that have higher performance than thin-film active circuits. Furthermore, the flatness, smoothness, chemical stability, and heat stability requirements for a destination substrate 20 used in embodiments of the present invention may be reduced because the adhesion and transfer process is not substantially limited by the material properties of the destination substrate 20. Manufacturing and material costs may be reduced because of high utilization rates of more expensive materials (e.g., the source substrate) and reduced material and processing requirements for the destination substrate 20.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus, and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 component/first component/printed component
12 second component
16 connection post/first connection post
17 second connection post
20 substrate/destination substrate
22 connection pad/first connection pad/substrate connection pad
23 second connection pad
24 solder
26 wire
30 stamp/transfer stamp
32 pillars
50 printed electrical connection structure
60 component source wafer
62 tether
64 anchor
68 patterned sacrificial layer
70 post side
72 circuit side
80 circuit
81 light-emitting diode
82 via
83 contact
84 electrode
86 dielectric substrate/component substrate
87 patterned dielectric
88 sacrificial portion
89 encapsulation layer/second dielectric layer
90 resin
100 provide destination substrate with connection pads step
110 coat resin on destination substrate step
120 micro-transfer print component from source wafer to destination substrate step
130 heat printed structure to reflow temperature step
140 cool printed structure to operating temperature step
150 test printed structure step
160 heat printed structure to cure temperature step
170 cool printed structure to operating temperature step
180 optional remove printed structure step
190 optional cut conductor to failed component step

The invention claimed is:

1. A method of making a printed structure, comprising:
providing a substrate, wherein one or more electrical connection pads are disposed on or in the substrate;
disposing a resin layer over and in contact with at least a portion of the substrate; and
micro-transfer printing a component from a component source wafer to the substrate in order to form the printed structure, wherein the component comprises one or more connection posts that are each positioned adjacent to a corresponding connection pad, so that the resin layer contacts at least a portion of the component after printing.

2. The method of claim 1, wherein the resin layer has a reflow temperature less than a cure temperature, wherein the resin layer can repeatedly flow at the reflow temperature when temperature is cycled between an operating temperature and the reflow temperature but cannot flow at the reflow temperature after the resin layer is exposed to the cure temperature.

3. The method of claim 2, comprising testing the component.

4. The method of claim 2, comprising:
heating the resin layer to the reflow temperature; and
electrically contacting each connection post to the corresponding connection pad.

5. The method of claim 4, comprising cooling the resin layer after said heating the resin layer to the reflow temperature.

6. The method of claim 5, comprising reheating the resin layer to the reflow temperature after said cooling the resin layer.

7. The method of claim 6, comprising cooling the resin layer after said reheating the resin layer to the reflow temperature.

8. The method of claim 7, comprising heating the resin layer to the cure temperature after said cooling the resin layer after said reheating the resin layer to the reflow temperature.

9. The method of claim 6, comprising testing the printed structure after said reheating the resin layer to the reflow temperature.

10. The method of claim 4, comprising testing the printed structure after heating the resin layer to the reflow temperature.

11. The method of claim 2, comprising:
heating the resin layer to the reflow temperature; and
electrically contacting each second connection post to the corresponding second connection pad.

12. The method of claim 2, comprising ordered steps of:
heating the resin layer to the reflow temperature;
cooling the resin layer;
testing the printed structure;
reheating the resin layer to the reflow temperature;
cooling the resin layer; and
heating the resin layer to the cure temperature.

13. The method of claim 1, comprising providing a layer of solder over at least the one or more connection pads, the layer of solder having a melting temperature.

14. The method of claim 13, comprising heating the layer of solder to the melting temperature.

15. The method of claim 13, comprising heating the layer of solder to the melting temperature after heating the resin layer to the reflow temperature.

16. The method of claim 13, comprising heating the layer of solder to the melting temperature after heating the resin layer to the cure temperature.

17. The method of claim 1, comprising:
providing an electrical conductor electrically connected to one of the one or more connection pads; and
cutting the electrical conductor.

18. The method of claim 1, wherein the component is a first component, the one or more connection pads are one or more first connection pads, and the method comprises:
providing one or more second connection pads electrically connected in parallel with the one or more first connection pads.

19. The method of claim 18, comprising determining that the first component failed the test.

20. The method of claim 19, comprising:
providing an electrical conductor electrically connected to one of the one or more connection pads; and
cutting the electrical conductor.

21. The method of claim 20, comprising testing the second component.

22. The method of claim 19, comprising micro-transfer printing a second component from the component source wafer or a different component source wafer to the substrate, the second component comprising one or more second connection posts that are each adjacent to a corresponding second connection pad, wherein the resin layer is contacted to at least a portion of the second component after printing.

23. The method of claim 1, wherein the component is a first component, the one or more connection pads are one or more first connection pads, and the method comprises:
providing one or more second connection pads electrically connected in parallel with the one or more first connection pads;
determining the first component failed the test;
micro-transfer printing a second component from the source component wafer or a different component source wafer to the substrate, the second component comprising one or more second connection posts that are each adjacent to a corresponding second connection pad, wherein the resin layer is contacted to at least a portion of the second component after printing.

* * * * *